United States Patent [19]

Otaka et al.

[11] Patent Number: 5,736,840
[45] Date of Patent: *Apr. 7, 1998

[54] PHASE SHIFTER AND COMMUNICATION SYSTEM USING THE PHASE SHIFTER

[75] Inventors: Shoji Otaka, Yokohama; Hiroshi Tanimoto, Kawasaki, both of Japan

[73] Assignee: Kabushiki Kaisha Toshiba, Kawasaki, Japan

[*] Notice: The term of this patent shall not extend beyond the expiration date of Pat. No. 5,650,714.

[21] Appl. No.: 625,368

[22] Filed: Apr. 1, 1996

Related U.S. Application Data

[63] Continuation-in-part of Ser. No. 303,815, Sep. 9, 1994, Pat. No. 5,650,714.

[30] Foreign Application Priority Data

| Sep. 9, 1993 | [JP] | Japan | 5-224365 |
| Aug. 4, 1995 | [JP] | Japan | 7-219880 |

[51] Int. Cl.⁶ ............................................. G05F 3/00
[52] U.S. Cl. ..................................... 323/217; 323/323
[58] Field of Search ................................ 323/212, 213, 323/217, 218, 323; 327/238, 254, 258

[56] References Cited

U.S. PATENT DOCUMENTS

| 3,568,045 | 3/1971 | Yorke | 323/217 |
| 3,694,567 | 9/1972 | Kresock | 323/217 |
| 4,725,767 | 2/1988 | Mori | 323/218 |
| 4,737,703 | 4/1988 | Hayakawa | 323/213 |
| 5,043,654 | 8/1991 | Philippe | 323/219 |

FOREIGN PATENT DOCUMENTS

| 60-43910 | 8/1983 | Japan. |
| 63-121307 | 11/1986 | Japan. |
| 3-109626 | 1/1990 | Japan. |

*Primary Examiner*—Matthew V. Nguyen
*Attorney, Agent, or Firm*—Oblon, Spivak, McClelland, Maier & Neustadt, P.C.

[57] ABSTRACT

A local signal of a predetermined frequency is supplied to an input terminal of a local signal input section. The local signal is applied to a control input terminal of a variable current supply and, in accordance with the local signal, a current is output from a variable current supply and sent to a phase-shifting section. The phase-shifting section includes two resonance circuits each comprised of a capacitor and inductor. The two resonance circuits are connected in parallel with a linear element constituting the local signal input section to output first and second output signals of the same frequency as that of the local signal and whose phases are shifted by a predetermined amount. The respective output signals of the phase-shifting section are output to a next stage through a signal output section comprised of two sets each of a current supply and transistor.

15 Claims, 12 Drawing Sheets

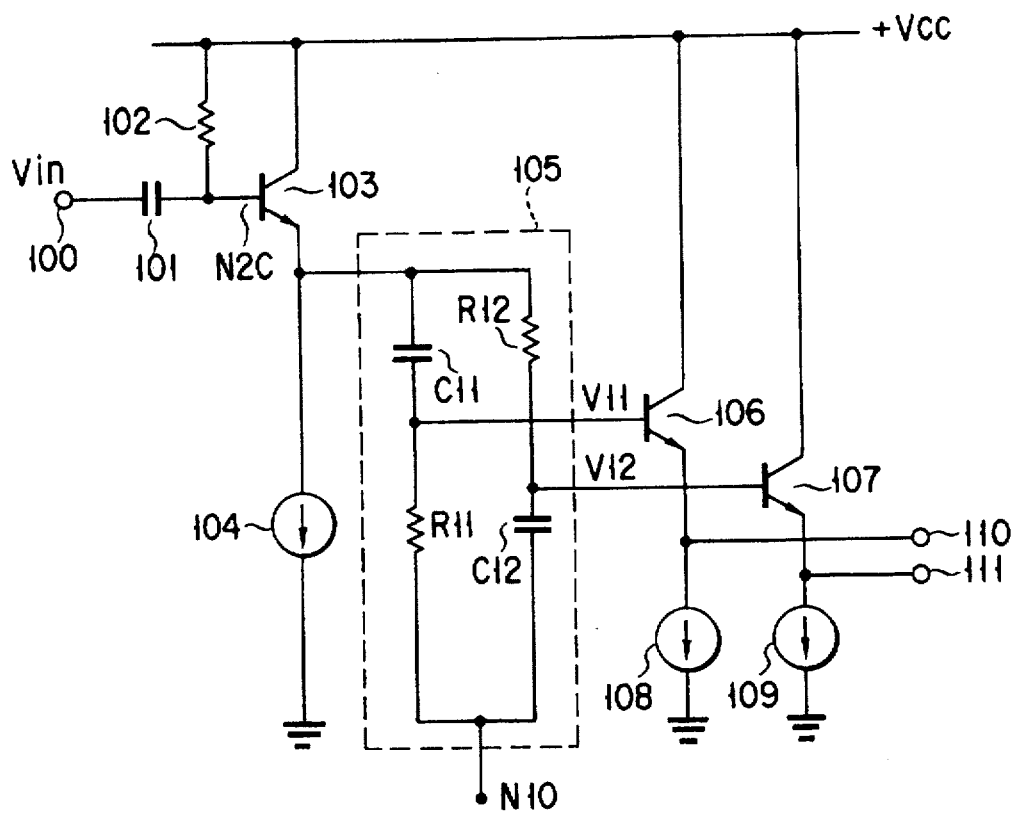
F I G. 1
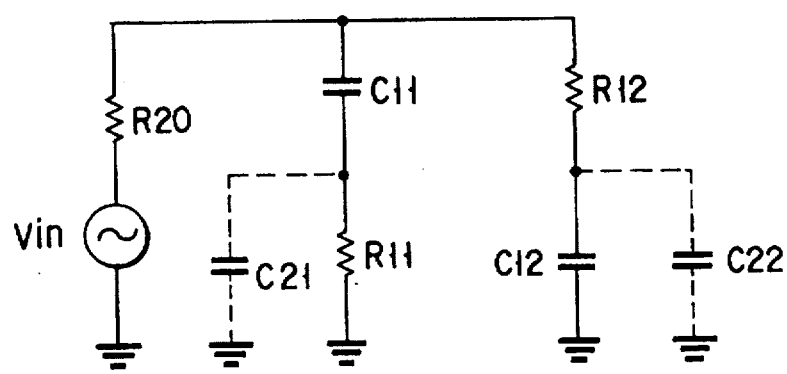
F I G. 2

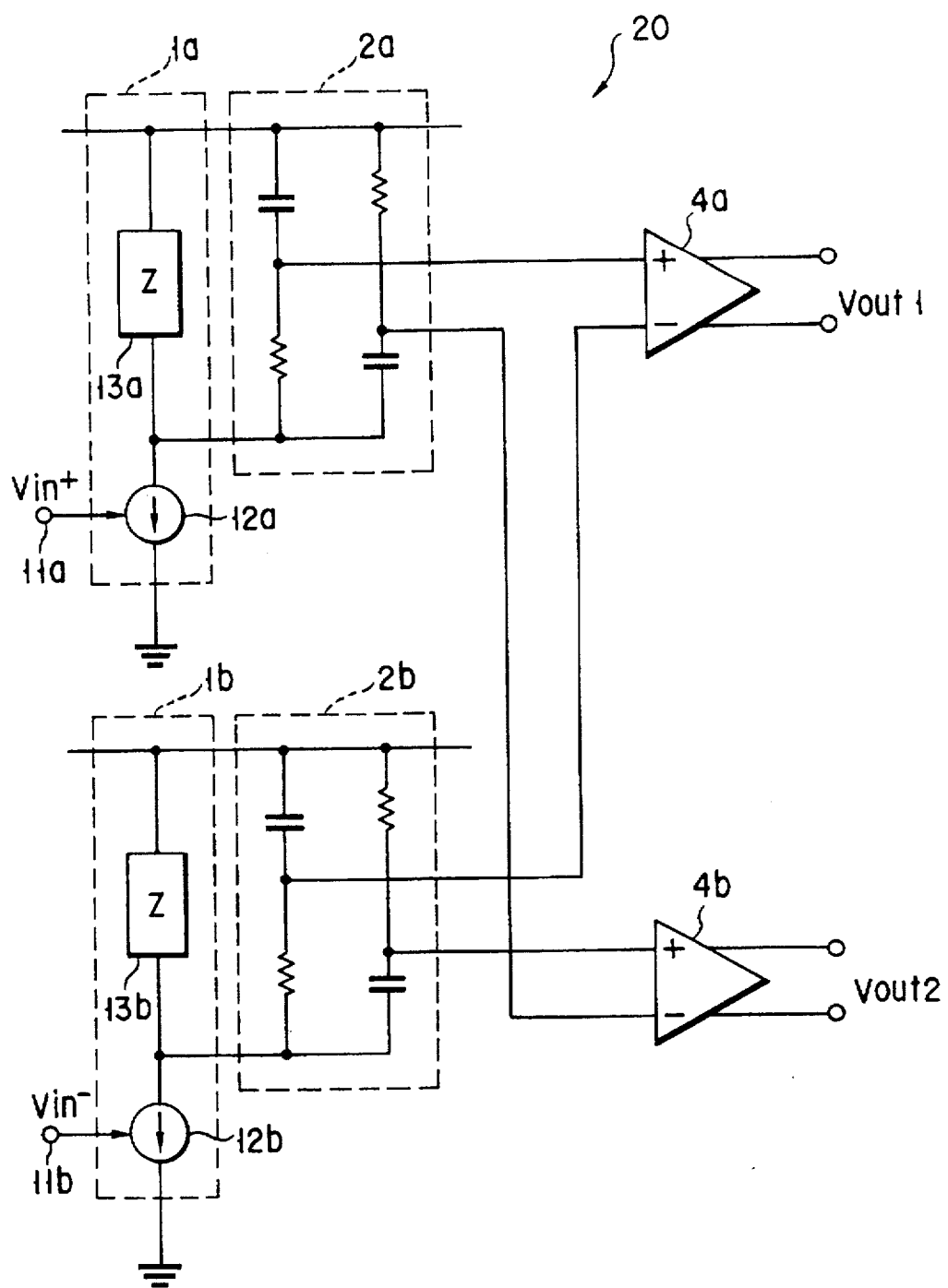
F I G. 10

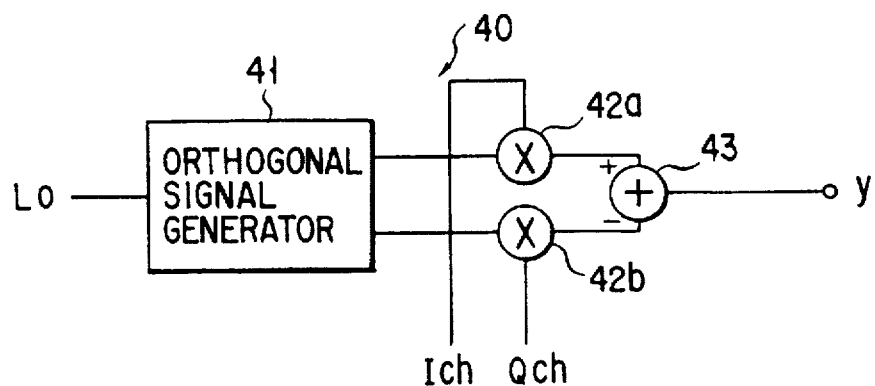
F I G. 11A
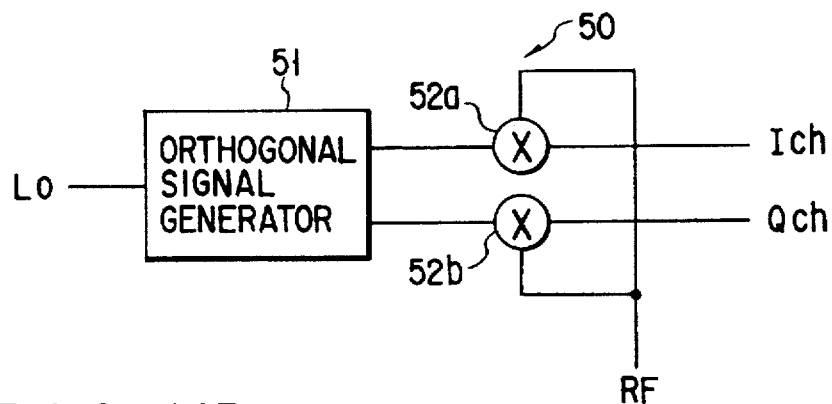
F I G. 11B
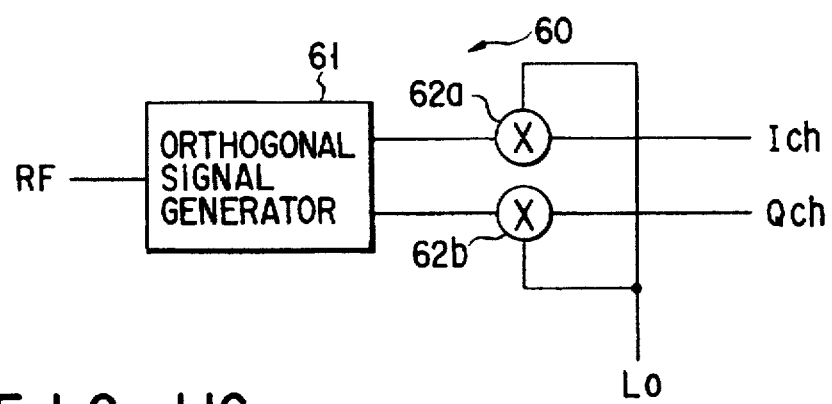
F I G. 11C

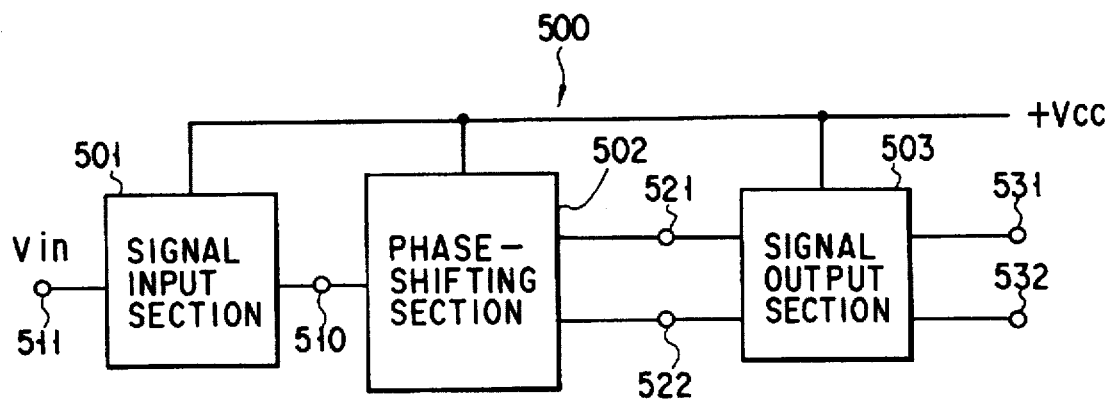
F I G. 15
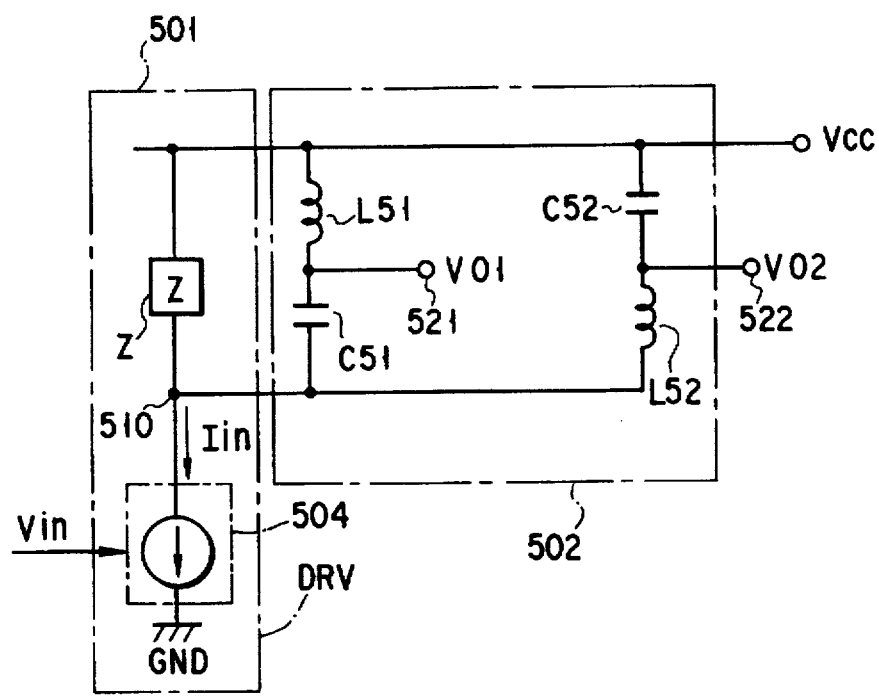
F I G. 16

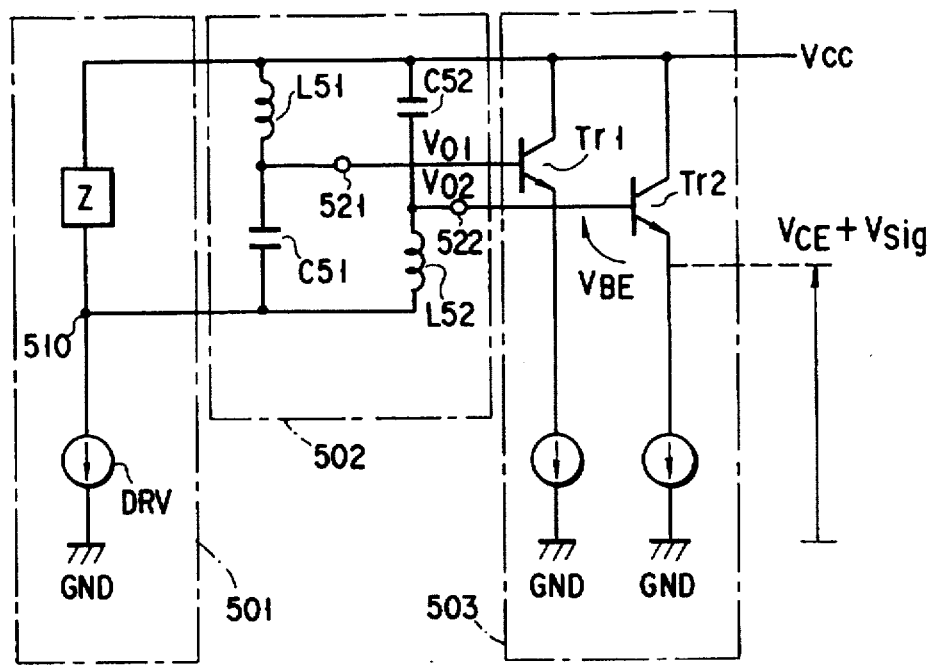
F I G. 17
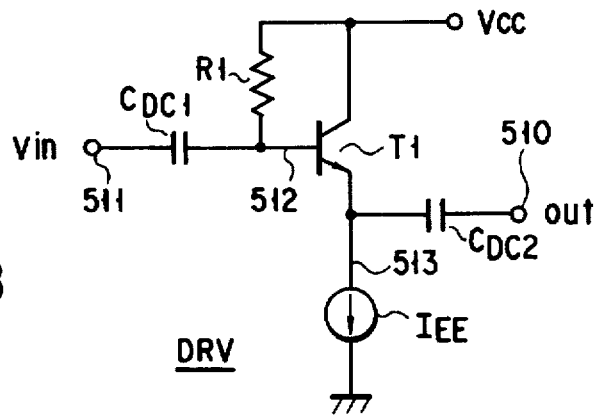
F I G. 18
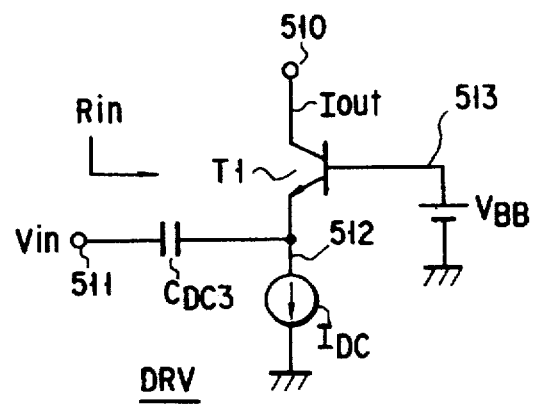
F I G. 19

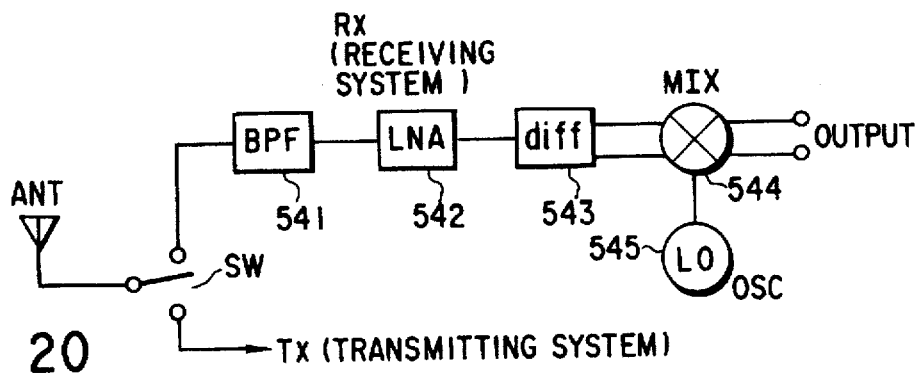
F I G. 20
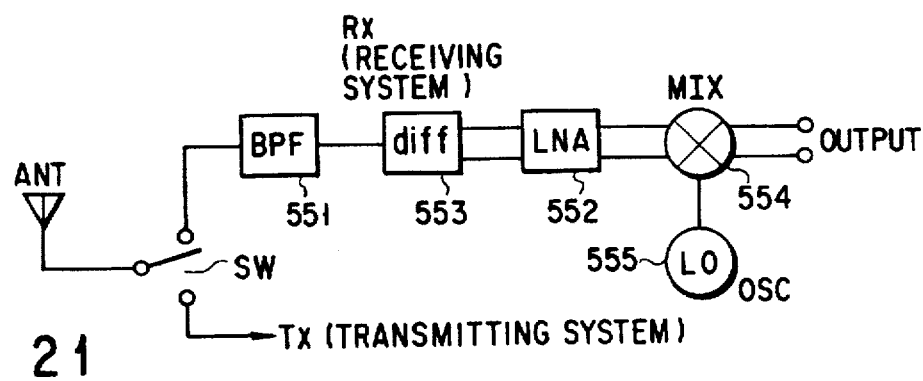
F I G. 21
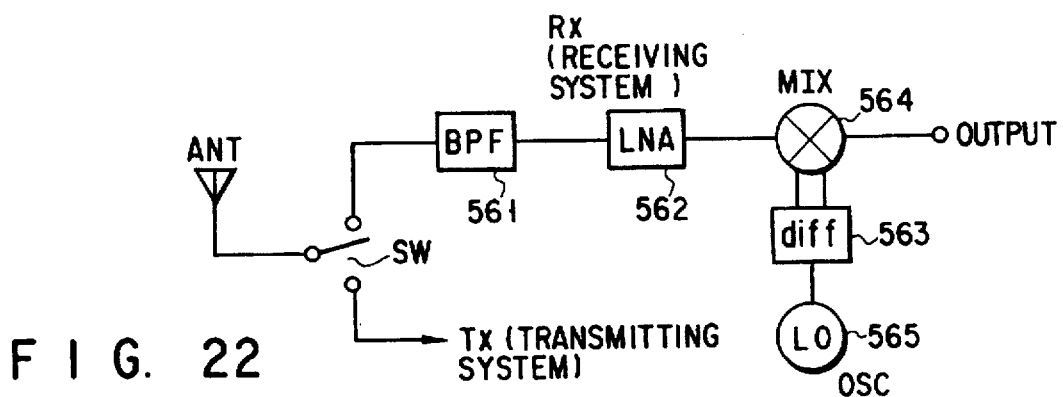
F I G. 22
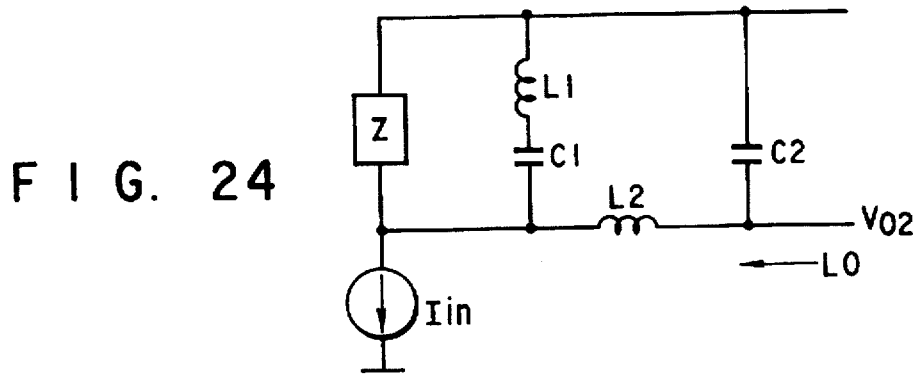
F I G. 24

PHASE SHIFTER AND COMMUNICATION SYSTEM USING THE PHASE SHIFTER

CROSS-REFERENCE TO THE RELATED APPLICATION

This application is a continuation-in-part of U.S. patent application Ser. No. 08/303,815, filed on Sep., 9, 1994 now U.S. Pat. No. 5,650,714.

BACKGROUND OF THE INVENTION

1. Field of the Invention

This invention relates to a phase shifter for a high-frequency signal and, in particular, to the phase shifter for generating signals differing from each other by a predetermined phase (180°) and a communication system using this phase shifter.

This invention relates to a signal generation system applied to a mobile communication device such as a portable wireless telephone or the like, and more particularly to an orthogonal signal generation system for generating carrier signals or RF (radio frequency) signals whose phases are different from each other by 90° and which are used for orthogonal modulation/demodulation.

2. Description of the Related Art

In recent years, as represented by portable wireless telephones and cellular (radio) phones, mobile communication devices which can communicate in desired places are actively developed. For example, since this type of communication device is carried by a man or mounted in a car, it is desired to reduce the size and weight of the communication device. For this purpose, parts of the communication device are required to be formed in a monolithic IC (integrated circuit) form suitable for reduction in size and weight rather than in the form of conventional hybrid IC. Further, since it is necessary to drive the portable wireless telephone by used of a battery, it is desired to develop an IC which is operated on a low voltage.

In the above-described mobile communication device, an orthogonal modulation/demodulation system for superposing a speech signal on two carriers whose phases are different from each other by 90° and transmitting the speech signal is generally used as a communication system. In order to realize the orthogonal modulation system, it is necessary to create carrier signals whose phases are different from each other by 90° from a local signal generated from a local oscillator at high s/n (signal to noise) ratio. In this invention, a system for generating two output signals such as the two carrier signals set in an orthogonal relation is called an orthogonal signal generation system.

In the circuit of the conventional orthogonal signal generation system, a resister for terminating to prevent reflection of the local signal is arranged at an input terminal inputting the local signal. Since the voltage amplitude of the output signal of the orthogonal signal generation circuit is determined by the power of the input signal, causing a problem that a sufficiently high voltage gain cannot be obtained when the resister for terminating is set to 50Ω or 70Ω for example. In principle, it is possible to increase the voltage gain by selectively setting the value of the terminal resistor, but in the GHz band, one of the values 50Ω and 75Ω can be generally selected because of the impedance of the transmission line.

In general, transistors are employed in the circuit of the orthogonal signal generation system. Assuming that two cascaded emitter follower are employed in the circuit and input signals are transmitted via the transistors, potentials of the output signals from the circuit are set to a low value by a voltage drop between a base and an emitter. Further, judging from the recent trend of the requirement for operating various types of devices on low voltage, it is anticipated that the power supply voltage for portable wireless telephones and the like will be less than or equal to approx. 2.5 [V], thereby the above voltage drop will become a serious problem. For example, when the output signals of the circuit are amplified by use of a differential amplifier, the voltage drop occurs at the common emitter terminal of a pair of emitter-coupled transistors constructing the differential amplifier. When the power supply voltage is 2.5 [V] and if VBE of the transistor is approx. 0.7 [V], the potential of the common emitter terminal is set to approx. 0.1 to 0.4 [V] and it becomes difficult to operate a current source connected to the common emitter terminal. That is, in general mobile communication devices, the circuit following the orthogonal signal generation system will be disable for operating by the voltage drop.

In order to solve the above problem it is possible to insert a capacitor between the output terminals of the circuit and the differential amplifier to cut off the DC component and shift the DC level of the input of differential amplifier by use of a level shifting circuit. However, with this construction, since it is necessary to form the level shifting circuit including the DC cut-off capacitor on an IC, the chip area and the lost of the power of the local signals are increased and the cost is raised and it is not preferable.

As described before, in the conventional orthogonal signal generation system, since the voltage (potential) of the output terminal is significantly lowered in comparison with a power supply voltage supplied to the system, it is not suitable for low voltage operation. Further, in the conventional orthogonal signal generation system, since it is required to attach a terminal resistor to the input side of a local signal, a sufficiently high voltage gain cannot be obtained.

SUMMARY OF THE INVENTION

A first object of this invention is to provide a phase shifter for generating signals, that is, signals whose phases are shifted by a predetermined amount from each other, in a way to reduce their amplitude error and phase shift error.

A second object of this invention is to provide an unbalanced to balanced conversion circuit which can achieve a stabilized power supply line by generating differential signals and can be driven by a lower voltage.

A third object of this invention is to provide an orthogonal signal generation system capable of creating two output signals whose phases are different from each other by 90° with high precision and providing a high voltage gain.

A fourth object of this invention is to provide an orthogonal signal generation system which can create two output signals whose phases are different from each other by 90° with high precision and which can be operated on low voltage.

According to a first aspect of this invention, there is provided an orthogonal signal generation system which comprises current control means including a variable current source, for controlling a current value according to an input signal; phase shifting means for outputting first and second signals whose phases are different from each other by 90°; and a power supply for supplying a preset voltage to the current control means and phase shifting means.

In the orthogonal signal generation system, the current control means includes a linear element connected between the power supply and the variable current source, and the phase shifting means includes an integrator and a differentiator which are connected in parallel with the linear element.

According to a second aspect of this invention, there is provided an orthogonal signal generation system which comprises first current control means including a first variable current source, for controlling a first current value according to an input signal; second current control means including a second variable current source, for controlling a second current value according to an inverted signal of the input signal; first phase shifting means for outputting a first signal and a second signal which is shifted from the first signal by a phase of 90°; second phase shifting means for outputting a third signal and a fourth signal which is shifted from the third signal by a phase of 90°; output means for outputting a first differential signal between the first and third signals and a second differential signal between the second and fourth signals; and a power supply for supplying a preset voltage to the first and second current control means and the first and second phase shifting means.

In the orthogonal signal generation system with the above construction, a current of an amplitude corresponding to an AC signal is created in the variable current source, and the current is supplied to the linear element and the integrator and differentiator of the phase shifting circuit. As a result, output signals whose phases are different from each other by 90° are output from the integrator and differentiator.

By adjusting a bias current of the variable current source, the input impedance can be set to a specified value without attaching a terminal resistor to the input side. As a result, the voltage gain can be increased.

Further, the potential of an input node of the phase-shifter, that is, the potential of the terminal connected to the variable current source via the linear element is set to the potential level subtracted a voltage drop of the linear element from the potential level of the power supply, and unlike the conventional case, it is not lowered by the base-emitter voltage of the transistor. Therefore, the operating voltage range is enlarged and the low-voltage operation can be effected. In particular, as the above voltage drop may be small when the linear element consists of an inductance element, it is possible to operate the orthogonal signal generation system by further low-voltage of the power supply. Further, it is not necessary to attach a DC cut-off capacitor to the output side, thereby making it possible to attain the construction which is suitable for formation of the monolithic IC and to get high gain because there is no power loss by a parasitic of DC cut off capacitor.

Further, since the DC potentials of the outputs of the integrator and differentiator of the phase shifting circuit can be both set to the same potential level as the power supply potential, parasitic capacitors associated with transistors constructing buffers can be made equal to each other when the buffers such as emitter followers are provided on the output sides of the integrator and differentiator. As a result, the phase error and amplitude error of the output signal caused by a deviation in the parasitic capacitors can be suppressed.

According to a third aspect of the present invention, there is provided a phase shifter comprising:
current control means including a variable current source, for controlling a current value according to an input signal; phase shifting means for outputting first and second signals having amplitude according to the controlled current value, whose phases are different from each other by a predetermined phase; and a power supply for supplying a preset voltage to the current control means and phase shifting means.

According to a fourth aspect of the present invention, there is provided an unbalanced to balanced converter comprising: an unbalanced to balanced conversion circuit comprised of a parallel combination of first and second series-connected resonance circuits each having a capacitor and an inductor, the capacitor of one of the first and second series-connected resonance circuits and the inductor of the other of the first and second series-connected resonance circuits being connected to a power supply, the inductor of the one of the first and second series-connected resonance circuit and capacitor of the other of the first and second series-connected resonance circuit being connected to an input terminal, these capacitors and these inductors respectively having the same element values with respect to each other; and input means including a variable current supply circuit for varying a current value in accordance with an input signal and a linear element connected at a one-end side to the power supply and at an other-end side to an output terminal of the variable current supply circuit which is an input terminal of the unbalanced to balanced conversion circuit.

According to the present invention, as a phase shifting section for converting an input signal to a differential signal use is made of a differential conversion circuit including LC resonance circuits. A linear element, excluding a capacitor, is connected to the differential conversion circuit such that an output of a variable current supply circuit is connected to the differential conversion circuit. By doing so it is possible to achieve a differential signal conversion. By a variable current supply circuit for making an output current value variable in accordance with an input signal the input signal is converted to a current signal which is supplied to an unbalanced to balanced conversion circuit. In this way, the unbalanced to balanced conversion circuit generates differential signals on the basis of the current.

In such a phase shifting section, since the input signal is converted to differential signals, the input signal, being in a high-frequency band, exerted little influence on the power supply.

According to the present invention, without using any emitter follower in an input circuit which has caused an operation voltage to be raised in the conventional case, use is made of an arrangement comprising a linear impedance element and a current supply for varying a current in a way to correspond to an RF input signal. As a result, the operation voltage is lowered and, even if any DC current component is contained in the RF input signal, it is possible to suppress an adverse influence resulting from a voltage drop, so that an operation can be effected under a low voltage.

Thus as the front end section of a communication system for wireless communication, etc., which uses such a phase shifting section, it is possible to, without exerting any adverse influence to the power supply, convert a received signal to a low frequency signal and, at the same time, drive the phase shifting section at a low voltage. With the use of such phase shifting section it is possible to achieve a stabilized power supply line and effect an operation at a low voltage and hence to obtain differential signals of high accuracy.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a circuit diagram showing the construction of the orthogonal signal generation system according to a first embodiment of the present invention;

FIG. 2 is an equivalent circuit diagram of a phase shifting circuit shown in FIG. 1;

FIG. 10 is a block diagram showing the construction of an orthogonal signal generation system according to a third embodiment of this invention;

FIGS. 11A to 11C are showing a modulator and a demodulator to which the orthogonal signal generation system of this invention is applied;

FIG. 15 is a block diagram showing a phase shifter according to this invention;

FIG. 16 is a circuit arrangement of a signal input section and phase shift section in FIG. 15;

FIG. 17 is a view showing a circuit arrangement of the phase shifter in FIG. 15;

FIG. 18 is a practical circuit configuration of a current supply circuit (driver) as shown in FIGS. 16 and 17;

FIG. 19 is a practical circuit configuration of a current supply circuit as shown in FIGS. 16 and 17;

FIG. 20 shows one practical application of the phase shifter of this invention to a front end section at a receiving section of a communication system;

FIG. 21 shows one practical application of the phase shifter of this invention to a front end section at a receiving system of the communication system;

FIG. 22 shows one practical application of the phase shifter of this invention to a front end section at a receiving system of a communication system;

FIG. 24 is a view showing a simplified form of the circuit shown in FIG. 16.

DETAILED DESCRIPTION OF THE PREFERRED EMBODIMENTS

Figure 3:
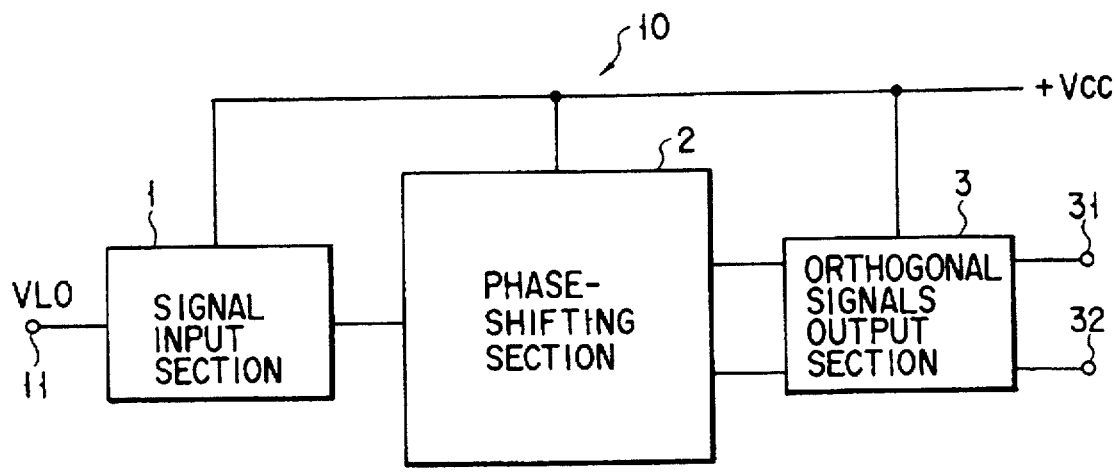
FIG. 3 is a block diagram showing the construction of an orthogonal signal generation system according to a second embodiment of this invention.

At first, a circuit shown in FIG. 1 according to the first embodiment of the present invention is provided in order to realize the orthogonal signal generation system. This circuit of the orthogonal signal generation system of the first embodiment is explained below with reference to FIGS. 1 and 2.

FIG. 1 shows the first provided circuit construction of the orthogonal signal generation system. A local signal input to an input terminal 100 is terminated at a terminal resistor 102 via a capacitor 101 and then input to a phase shifting circuit 105 via an emitter follower circuit which is constructed by a transistor 103 and a current source 104. The phase shifting circuit 105 includes a differentiator constructed by a capacitor C11 and a resistor R11 and an integrator constructed by a resistor R12 and a capacitor C12. A node N10 between the resistor R11 and the capacitor C12 is connected to a low impedance such as a power supply VCC or ground terminal, for example. The phase shifting circuit 105 outputs a signal whose phase is advanced with respect to the phase of a local signal from the differentiator and a signal whose phase is delayed with respect to the phase of a local signal from the integrator. An output signal of the differentiator is supplied to an output terminal 110 via an emitter follower circuit constructed by a transistor 106 and a current source 108, and an output signal of the integrator is supplied to an output terminal 111 via an emitter follower circuit constructed by a transistor 107 and a current source 109. Since the circuit is assumed to deal with a signal of GHz band, the circuit is constructed to have a terminal resistor 102 for impedance matching and permit only an AC component of the local signal to be supplied to the phase shifting circuit 105 by use of the capacitor 101.

In the orthogonal signal generation system, two output signals whose phases are different from each other by 90° and whose amplitudes are equal to each other are supplied to the output terminals 110, 111 by determining the element value as follows.

R11=R12, C11=C12

$$1/(\omega_c * C11) = R11 \tag{1}$$

where $\omega_c$ is a local signal frequency.

FIG. 2 shows an equivalent circuit of the phase shifting circuit shown in FIG. 1. R20 denotes an equivalent resistor of the transistor 103 as viewed from the emitter side thereof, and one end of the resistor is connected to a signal source Vin and the other end thereof is connected to the phase shifting circuit 105. C21, C22 denote parasitic capacitors such as a capacitor between the capacitor electrode and the ground. C11, C12 denote base-collector capacitors (Cμ) of the transistors 106, 107.

If the parasitic capacitors C21 and C22 are equal to each other, two output signals having no phase difference and no amplitude difference can be derived from the output terminals 110 and 111. However, if the parasitic capacitors C21 and C22 are made different from each other by a difference in the base-collector voltage of the transistors 106 and 107 or a variation in the manufacturing process, the phase relation and amplitude ratio between the two output signals derived from the output terminals 110 and 111 are changed. Therefore, in general, the sizes of the transistors 106, 107 are reduced so that the ratio of the capacitors C11, C12 to the parasitic capacitors C21, C22, i.e. the ratios of the capacitor C21 to the capacitor C11 and the capacitor C22 to the capacitor C12, can be reduced to suppress the influence by a fluctuation in the parasitic capacitors C21, C22.

In the circuit of the orthogonal signal generation system shown in FIG. 1, a sufficiently high voltage gain can not be attained. Because input voltage is smaller as input impedance is smaller when applied power is constant. That is, input voltage decreases if input impedance is small such as 50Ω or 75Ω. As will be described in detail later, the maximum gain of the output signal to the input signal of the conventional orthogonal signal generation system is $1/\sqrt{2}$. In principle, it is possible to increase the voltage gain by selectively setting the value of the terminal resistor 102, but in the GHz band, only one of the values 50Ω and 75Ω can be generally selected because of the impedance of the transmission line.

Further, the circuit constructing the orthogonal signal generation system has an advantage that the high precision can be maintained in a range up to the GHz band, but it has a disadvantage that it is not suitable for low-voltage operation by the following reason.

In FIG. 1, the potentials of the output terminals 110, 111 are set at maximum to a value which is lower than the power supply voltage +VCC by $2V_{BE}$ ($V_{BE}$ is a base-emitter voltage of the transistor). For example, the potential obtained at the output terminal 110 is set to a potential (+VCC–$V_{BE}$) which is lower than +VCC by $V_{BE}$ of the transistor 106, and the potential obtained at the output terminal 111 is set to a potential (+VCC–$2V_{BE}$) which is lower than +VCC by $V_{BE}$ of the transistors 103, 107.

Assuming that the output signals from the output terminals 110, 111 are generally amplified by use of a differential amplifier, the potential of the common emitter terminal of a pair of emitter-coupled transistors constructing the differential amplifier is further lowered by $V_{BE}$ of the transistor, and as a result, a voltage drop of $3V_{BE}$ with respect to the power supply voltage +VCC will occur.

Next, there will now be described second and third embodiments of this invention with reference to the accompanying drawings.

FIG. 3 shows the schematic construction of an orthogonal signal generation system according to a second embodiment of this invention. The orthogonal signal generation system 10 includes a signal input section 1, phase shifting section 2, and orthogonal signal generation output section 3. Each section is supplied with a power supply voltage +VCC.

The signal input section 1 generates a current corresponding to the signal generated from a local oscillator, and supplied the current to the phase shifting section 2. The phase shifting section 2 has an integrator and a differentiator and supplies signals (orthogonal signals) whose phases are different from each other by 90° to the orthogonal signal output section 3 according to the current supplied from the signal input section 1. The orthogonal signal output section 3 has a buffer circuit and transmits the orthogonal signals supplied from the phase shifting section 2 to the next stage via output terminals 31, 32.

Figure 4:
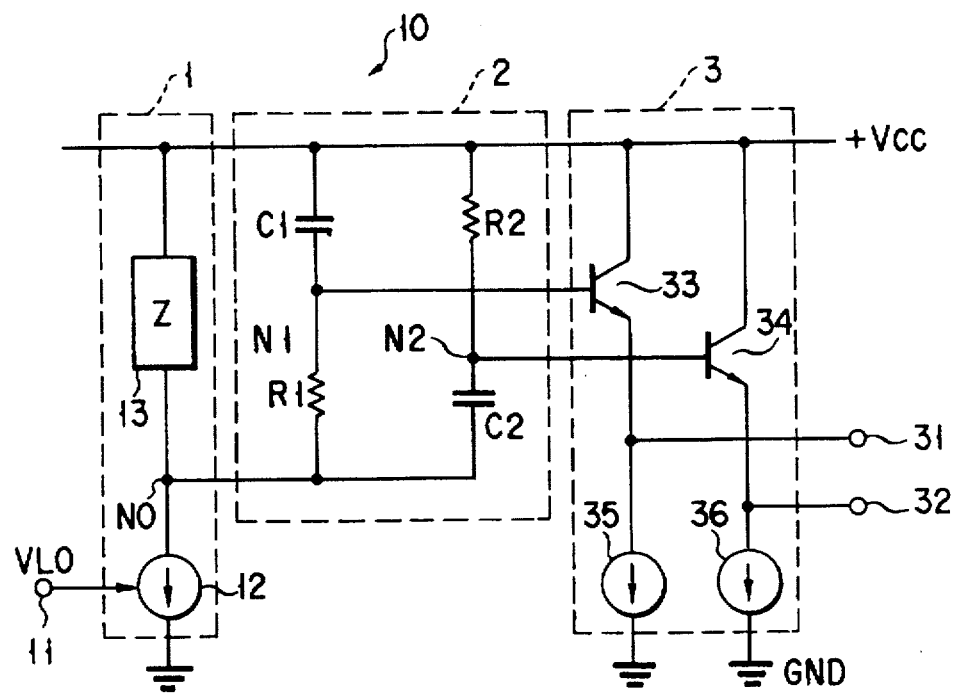
FIG. 4 is a diagram showing the circuit construction of the orthogonal signal generation system shown in FIG. 3.

An example of the concrete circuit construction of the above orthogonal signal generation system is shown in FIG. 4. An AC input signal, for example, local signal VL0 generated from a local oscillator (not shown) is supplied to the input terminal 11 of the signal input section 1 shown by chain lines in FIG. 4. The local signal VL0 is supplied to a control input terminal of a variable current source 12. As a result, a current whose value varies according to the local signal VL0 is output from the variable current source 12. One end of the variable current source 12 is connected to the ground and the other end (node N0) thereof is connected to a positive power supply +VCC via a linear element 13. The linear element 13 is constructed by a passive element such as an inductor or resistor, for example. A circuit of the phase shifting section 2 is connected in parallel with the linear element 13.

The phase shifting section 2 includes an integrator which is constructed by a series circuit of a first capacitor C1 and a first resistor R1 and a differentiator which is constructed by a series circuit of a second resistor R2 and a second capacitor C2. With the above circuit construction, first and second output signals whose phases are different from each other by 90°.

The output node N1 (which is a connection node between the capacitor C1 and the resistor R1) of the integrator of the phase shifting section 2 and the output node N2 (which is a connection node between the resistor R2 and the capacitor C2) of the differentiator are respectively connected to the bases of transistors 33 and 34 in the orthogonal signal output section 3. The orthogonal signal output section 3 has current sources 35, 36 in addition to the transistors 33, 34. The transistors 33, 34 constitute emitter follower circuits in cooperation with the respective current sources 35, 36 and are used as buffer circuits for transmitting the output signals of the phase shifting section 2 to the next stage via the output terminals 31, 32. That is, the collectors of the transistors 33, 34 are connected to the power supply +VCC and the emitters thereof are respectively connected to one-side ends of the current sources 35, 36 and to the output terminals 31, 32. The other ends of the current sources 35, 36 are connected to the ground GND.

Figure 5:
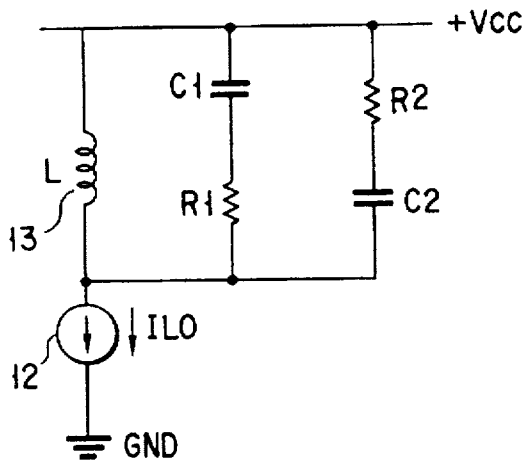
FIG. 5 shows a first example of an equivalent circuit of a phase shifting section shown in FIG. 4.

Next, the operation of the orthogonal signal generation system constructed as shown in FIG. 4 is explained with reference to the equivalent circuit of FIG. 5. Assume that the linear element 13 is an inductor of inductance L and C1=C2 and R1=R2 as shown in FIG. 5. An AC component ILO (which is hereinafter referred to as a local signal current) which is contained in the current output from the variable current source 12 and which corresponds to the local signal VL0 is distributed to the linear element 13, integrator (C1, R1) and differentiator (C2, R2). In this case, if the current flowing in the integrator is Iint and the current flowing in the differentiator is Idif, then the currents Iin and Idif can be expressed by the following equation.

$$Iint = Idif \qquad (2)$$
$$= 1/(R/j\omega cL - 1/\omega^2 CL + 2) \cdot ILO$$

wherein C=C1=C2, R=R1=R2, and ωc is a local signal frequency.

It is understood from the equation (2) that the local signal current ILO can be input to the phase shifting section 2 with the current gain of substantially 1 by increasing the inductance L. Further, if the resonance frequency of L and C is set equal to the local signal frequency fc, |Iint|, |Idif| are set less than 0.67 and the ratio (current gain) of the local signal current ILO to the input current (currents flowing in the integrator and differentiator) of the phase shifting section 4 can be set equal to or larger than 0.5. As a gain of the orthogonal signal generation system is related to values of the resistors and capacitors that constitute the phase shifting section 2, the total gain is explained below.

As described before, orthogonal signals or first and second output signals whose phases are different from each other by 90° can be derived from the integrator and differentiator by inputting the local signal ILO to the integrator and differentiator of the phase shifting section 2. The first and second output signals are respectively supplied to the output terminals 31, 32 via the emitter follower circuits which are respectively constructed by the transistor 33 and current source 25 and the transistor 34 and current source 36. A differential amplifier is generally connected to the succeeding state of the orthogonal signal output section 3, that is, output terminals 31, 32. The differential amplifier and the phase shifting section 2 are electrically isolated from each other by the emitter follower circuit.

In the orthogonal signal generation system of the first embodiment, when the linear element consists of inductance element, since the potential of the input node N0 of the phase shifting section 2 is set to the same potential level as the power supply +VCC, the operation voltage range can be enlarged by the base-emitter voltage $V_{BE}$ of the transistor in comparison with the conventional circuit construction shown in FIG. 1. That is, in the conventional circuit shown in FIG. 1, the potentials of the output terminals 110, 111 are set to the potential level which is lower than +VCC by $2V_{BE}$, but in the circuit of this embodiment shown in FIG. 4, the potentials of the output terminals 31, 32 are set to the potential level which is lower than VCC only by $V_{BE}$.

Therefore, assuming that the output signals from the output terminals 31, 32 are input to the differential amplifier, the potential of the common emitter terminal of the paired emitter coupled transistors in the differential amplifier is lowered than +VCC only by $2V_{BE}$. As a result, the potential of the common emitter terminal becomes equal to or higher than 1 [V] and the current source connected to the common emitter terminal can be operated without causing any problem even when +VCC is lowered to approx. 2.5 [V] in a portable wireless telephone, for example.

Further, in this embodiment, since the potentials of the output nodes N1, N2 of the integrator and differentiator of the phase shifting section 2 are set equal to +VCC, the base-collector capacitances (Cμ) of the transistors 33, 34 becomes equal to each other at the DC operating point. On the other hand, in the conventional case shown in FIG. 1, since it is difficult to set the base potentials of the transistors 106, 107 equal to each other, it is difficult to set the capacitances Cμ of the transistors equal to each other. A deviation in the capacitance Cμ (parasitic capacitance) caused by the DC bias causes a phase error and amplitude error in the orthogonal signals created by the orthogonal signal generation system. Therefore, the circuit of this embodiment is improved over the conventional circuit in the phase and amplitude precision.

Figure 6:
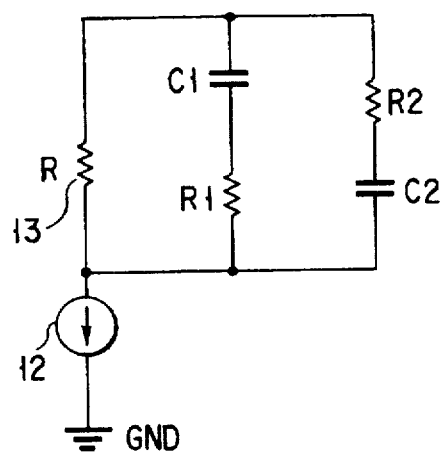
FIG. 6 shows a second example of the equivalent circuit of the phase shifting section shown in FIG. 4.

In the first embodiment, the inductor is used as the linear element 13 as shown in FIG. 5, but a resistor R may be used as shown in FIG. 6. In this case, the potential of the input node N0 of the phase shifting section 2 is slightly lowered from +VCC by a current flowing in the resistor R and the operation voltage range is narrowed in comparison with a case where the inductor is used as the linear element 13. However, it is easy to design that a voltage drop across the resistor R can be made smaller than the base-emitter voltage $V_{BE}$, for example, it can be set to approx. 0.3 [V]. Therefore, the operation voltage range can be enlarged by at least approx. 0.4 [V] in comparison with the circuit used in the conventional case. Further, the base-collector capacitances of the transistors 33, 34 are made different from each by the voltage drop across the resistor R, but the difference between them is smaller than that in the circuit of the conventional case.

Next, the construction and operation of the variable current source 12 are explained with reference to the accompanying drawings. When the frequency of the local signal VL0 which is an AC input signal of the orthogonal signal generation circuit is a frequency of GHz band, it is necessary to attain the impedance matching with the transmission line for transmitting the local signal from the local oscillator in the signal input section 1 of the orthogonal signal generation system 10 in order to input the local signal from the local oscillator without occurrence of signal reflection. The characteristic impedance of the transmission line is generally 50Ω, and in this case, the input impedance of the orthogonal signal generation system 10 is set to 50Ω.

Figure 7:
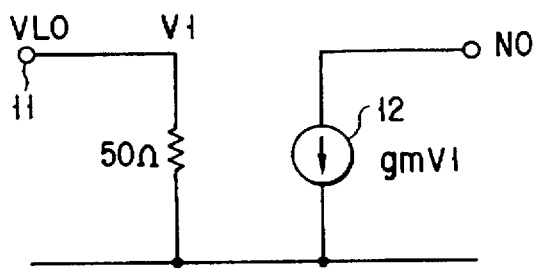
FIG. 7 is an equivalent circuit diagram of a variable current source shown in FIG. 4.

FIG. 7 shows an equivalent circuit of the variable current source 12 shown in FIG. 4 in the signal input section 1 of the orthogonal signal generation system 10. The input impedance of the input terminal 11 is 50Ω. Assume that the local signal current ILO flowing in the variable current source 12 has the relation expressed by the following equation with respect to the potential of the input terminal 11, that is, the voltage of the local signal VL0.

$$IL0 = gm*VL0 \quad (3)$$

where gm is a transconductance.

By use of the above variable current source 12, the local signal VL0 can be converted into a local signal current IL0 with high linearity.

Figure 8:
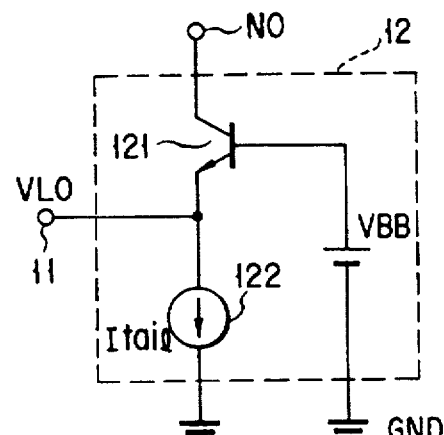
FIG. 8 is a circuit diagram showing a first concrete example of the variable current source shown in FIG. 4.

FIG. 8 shows a first concrete example of the variable current source 12 realizing the equivalent circuit shown in FIG. 7. The input terminal 11 is connected to the emitter of a transistor 121 and to one end of a current source 122. The other end of the current source 122 is grounded. The base of the transistor 121 is grounded via a voltage source VBB. The collector of the transistor 121 is a current output terminal of the variable current source 12 and corresponds to the node N0 shown in FIG. 4. The input impedance Rin of the variable current source 12 can be approximately expressed by the following equation by setting the current of the current source 122 to Itail.

$$Rin = 1/gm \quad (4)$$

wherein gm=Itail/Vt, Vt (thermal voltage)=kT/q, k is the Boltzmann's constant, and q is the charge of an electron.

The input impedance Rin can be set to 50Ω by adjusting the bias current of the transistor 121, that is, the current Itail of the current source 122. Therefore, the current gain of the variable current source 12 is set to 1 according to the equations (3) and (4) the output current IL0 becomes equal to the AC component of the current based on the local signal VL0 input to the input terminal 11.

Figure 9:
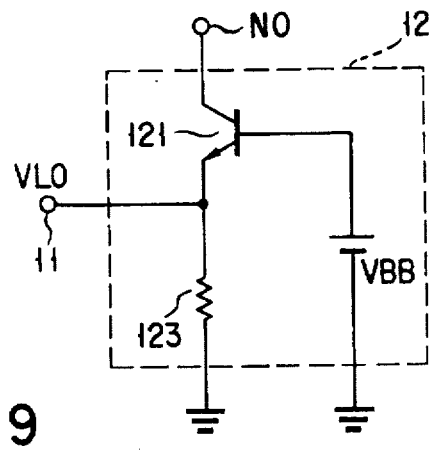
FIG. 9 is a circuit diagram showing a second concrete example of the variable current source shown in FIG. 4.

FIG. 9 shows a second concrete example of the variable current source 12 realizing the equivalent circuit shown in FIG. 7. As shown in FIG. 9, the circuit construction of the second concrete example is obtained by replacing the current source 122 shown in FIG. 8 by a resistor 123. Since the potential of the input terminal 11 is given by (VBB−0.7 [V]) when the transistor 121 is operated, a desired current Itail can be obtained by setting the resistance R123 of the resistor 123 to a value expressed by the following equation.

$$Itail = (VBB - 0.7)/R123 \quad (5)$$

In this case, since the input impedance Rin is a parallel resultant resistance of the impedance 1/gm as viewed from the emitter side of the transistor 121 and the resistance R123, Rin=50Ω can be realized with a current smaller than Itail give in FIG. 8. At this time, the current gain of the variable current source 12 is lowered by a conductance of 1/R123, but it is easy to obtained a current gain equal to or larger than 0.8.

Next, the voltage ratio of the local signal VL0 input to the input terminal 11 to the output signal of the orthogonal signal generation system 10, that is, the voltage gain is explained in comparison with that of the circuit in the conventional case shown in FIG. 1. In this case, assume that the output impedance of the signal source connected to the input terminal 11 is 50Ω and transistors and passive elements used in the signal source and the orthogonal signal generation system are all ideal parts.

In the conventional circuit shown in FIG. 1, if the voltage of the signal source is Vin and the resistance of the terminal resistor 102 is 50Ω, then the potential VN20 of the node N20 is expressed by the following equation.

$$VN20=Vin/2 \quad (6)$$

Since the voltage gain of the emitter follower constructed by the transistor 103 and the current source 104 is ideally set to 1, an input voltage of the phase shifting circuit 105 is equal to the voltage of the node N20. Under the condition of the equation (1), the output signals V11, V12 of the phase shifting circuit 105 are expressed by the following equation irrespective of the values of the capacitors and the resistors.

$$V11 = V12 = 1/(2 \cdot \sqrt{2})Vin \quad (7)$$

Therefore, the gain of the conventional circuit is set to $1/(2\times\sqrt{2})$ at maximum in a system which is designed by taking the impedance matching into consideration.

On the other hand, in the orthogonal signal generation system of this invention, the current gain is set to 1 as described before, and the following equation can be attained.

$$IL0=Vin/100 \quad (8)$$

Therefore, the output voltage V2 of the integrator is expressed by the following equation.

$$|V2|=1/(\omega cL-1/\omega c^2 CL+2) \cdot R2 \cdot Vin/100 \quad (9)$$

A value of approx. 0.67 can be obtained as the term of the absolute value in the equation (9) by adequately setting the local signal frequency to the resonance frequency of C and L, and the following expression can be obtained.

$$|V2|\leq 0.0067 * R2 * Vin \quad (10)$$

In order to make the voltage gain of the orthogonal signal generation system higher than the voltage gain of the conventional case, the condition expressed by the following expression may be satisfied.

$$0.067 * R > 1/(2 \cdot \sqrt{2}) \quad (11)$$

Based on the above expression, the following expression can be obtained.

$$R > 52\Omega \quad (12)$$

Therefore, by setting the resistance R2 equal to or larger than 52Ω, the voltage gain can be made higher than that of the circuit of the conventional orthogonal signal generation system shown in FIG. 1.

If actual numeric values are used, for example, if the local signal frequency fc is set to 2 GHz, the element values of the respective circuit sections are set such that C=C1=C2=0.6 pF, R=R1=R2=140Ω, and L=10 nH, then the current gain can be set to 0.93 according to the equation (9) and is approximately twice as high as that of the conventional case. In order to obtain the gain equivalent to that of the conventional case, the numeric values may be set under the condition of the equation (12) such that C=C1=C2=1.5 pF, R=R1=R2=52Ω, and L=4.2 nH. Therefore, if it is necessary to increase the capacitances of the capacitors C1, C2 in order to reduce the phase error due to the parasitic capacitor, the gain can be made higher than that of the conventional case when the capacitances are set equal to or less than 1.5 pF.

In the first embodiment, the inductor is used as the linear element 13, but it is clearly understood that the gain can be made higher than that of the conventional case even when a resistor is used as described before. However, since the resonance by L and C cannot be used, the gain is reduced in comparison with a case wherein the inductor is used.

Further, in the embodiments described in this detailed description, the bipolar transistors are used, but GaAs FETs or MOSFETs can be used.

The orthogonal signal generation system can be formed of the differential type based on the first embodiment shown in FIG. 4. The orthogonal signal generation system of the differential type is shown in FIG. 10. As shown in FIG. 10, in the third embodiment, two signal input sections and two phase shifting sections which respectively correspond to the signal input section 1 and the phase shifting section 2 of the second embodiment are used and two differential amplifiers are used instead of the orthogonal signal output section 3. That is, the orthogonal signal generation system 20 includes the signal input sections 1a, 1b, phase shifting sections 2a, 2b, and differential amplifiers 4a, 4b. Further, the orthogonal signal generation system 20 may includes buffer circuits such as the orthogonal signals output section 3 shown in FIG. 3 at the following of the phase shifting sections 2a, 2b respectively.

In the signal input sections 1a, 1b, AC input signals are supplied to input terminals 11a, 11b in a differential signal form. That is, the AC input signal supplied to the input terminal 11a and the AC input signal up lied to the input terminal 11b have phases different from each other by 180°. The AC input signals supplied to the input terminals 11a, 11b are supplied to the control input terminals of variable current sources 12a, 12b.

The signal input section 1a and the phase shifting section 2a, constitute a first orthogonal signal generating section, and the signal input section 1b and the phase shifting section 2b constitute a second orthogonal signal generating section. A difference voltage between output signals from the integrators of the phase shifting sections 2a, 2b is amplified by the first differential amplifier 4a. A difference voltage between output signals from the differentiators of the phase shifting sections 2a, 2b is amplified by the second differential amplifier 4b. As a result, first and second output signals whose phases are different from each other by 90° can be derived from the differential amplifiers 4a, 4b. Further, according to the second embodiment, the design of the differential amplifiers 4a, 4b can be simplified and the high-frequency characteristic can be improved.

As described above in detail, in the orthogonal signal generation system of this invention, the phase precision and the amplitude precision of the output orthogonal signals whose phases are different from each other by 90° are high and a higher voltage gain can be attained. According to the orthogonal signal generation system, the low-voltage operation can be attained, and since the DC cut-off capacitor is not necessary, it can be suitably formed in the form of monolithic IC. Thus, it is suitable for a small-sized mobile communication device whose power supply voltage is low.

A modulator 40 and demodulators 50 and 60, each being a direct conversion type one, to which this invention is applied, will be described below with reference to FIGS. 11A, 11B and 11C.

As shown in FIG. 11A, the modulator 40 comprises an orthogonal signal generator 41 to which the orthogonal signal generation system of the invention is applied. A local signal Lo is input to the orthogonal signal generator 41, which generates two signals from the local signal Lo. These signals have phase difference 90° between them. The first signal is supplied to a multiplier 42a, and the second signal to a multiplier 42b. Two signals Ich and Qch, which are of different bands, are supplied to the multiplier 42a and 42b, respectively. The multiplier 42a multiplies the first signal by the signal Ich. The multiplies 42b multiples the second signal by the signal Qch. The signals output from the multipliers 42a and 42b are input to an adder 43. The adder 43 adds these signals together, generating a signal y(t). The signal y(t) is given as follows:

$$y(t)=Ich(t)\cdot\cos(\omega ct)-Qch(t)\cdot\sin(\omega ct) \quad (13)$$

where $\cos(\omega ct)$ and Ich(t) are the signals supplied to the multiplier 42a, and $\sin(\omega ct)$ and Qch(t) are the signals supplied to the multiplier 42b.

Since the orthogonal signal generation system can acquire high gain as describe above, the proposed orthogonal signal generation system needs lower input power compared with conventional orthogonal signal generation system. Therefore, using the proposed circuit, local power is reduced. Moreover, because carrier feed-through from input terminal to output terminal depends on the input local power, carrier feed-through is reduced using the proposed circuit.

FIG. 11B shows the demodulator 50 which comprises an orthogonal signal generator 51 to which the orthogonal signal generation system of the invention is applied. A local signal Lo is input to the orthogonal signal generator 51, which generates two signals from the local signal Lo. These signals have phase difference of 90° between them. The first signal is supplied to a multiplier 52a, and the second signal to a multiplier 52b. An RF signal is also supplied to the multipliers 52a and 52b. The multiplier 52a multiplies the first signal by the RF signal and generates a signal Ich. The multiplier 42b multiples the second signal by the RF signal and generates a signal Qch.

Since the orthogonal signal generation system can acquire a large gain as described above, it can generate a signal of the same magnitude (level) as the output signal of the conventional orthogonal signal generation system, even if the local signal Lo has a small magnitude. Hence, input power applied to the demodulator 50 is small using the proposed circuit.

FIG. 11C shows the demodulator 60 which comprises an orthogonal signal generator 61 to which the orthogonal signal generation system of the invention is applied. An RF signal is input to the phase-shifting circuit 61, which generates two signals from the RF signal. These signals have phase difference of 90° between them. The first signal is supplied to a multiplier 62a, and the second signal to a multiplier 62b. A local signal Lo is also supplied to the multipliers 62a and 62b. The multiplier 62a multiplies the first signal by the local signal Lo and generates a signal Ich.

The multiplier 62b multiplies the second signal by the local signal Lo and generates a signal Qch.

Since the orthogonal signal generation system can acquire a large gain as described above, the RF signal input to the orthogonal signal generator 61 has a great gain.

Figure 12:
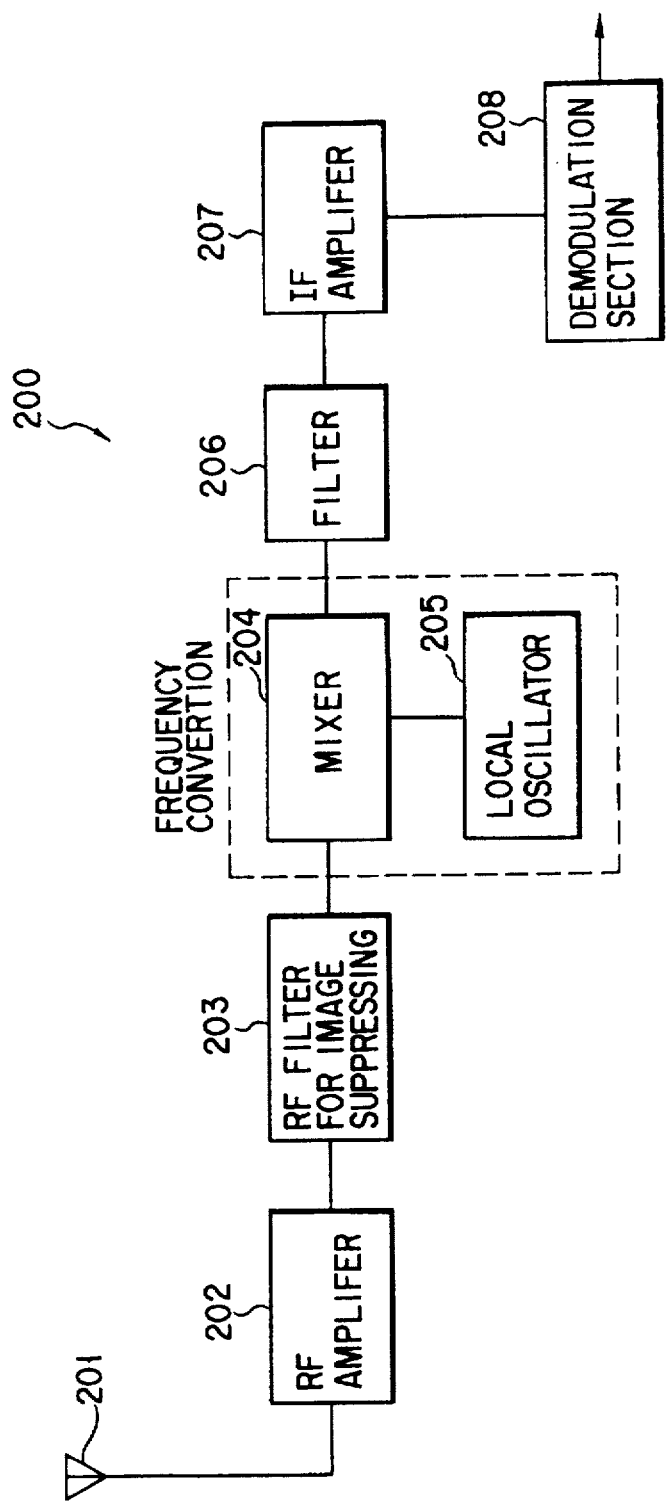
FIG. 12 is a block diagram showing the construction of a receiving section of a communication device to which a super-heterodyne system is applied.

Next, an example of the mobile communication device to which this invention is applied to explained. FIG. 12 shows the schematic construction of a receiver to which a super-heterodyne system is applied. The receiver 200 includes an antenna 201, high-frequency amplifier 202, image compressing RF filter 203, mixer 204, local oscillator 205, filter 206, IF amplifier 207, and demodulator 208.

An RF signal received by the antenna 210 is amplified by the RF amplifier 202 and then supplied to the image compressing RF filter 203. The RF signal is subjected to the filtering process in the image compressing RF filter 203 so that the image frequency component thereof will be eliminated. After this, the RF signal is mixed with a carrier created by the local oscillator 205 in the mixer 204 and the frequency thereof is converted into an intermediate frequency. In general, in the super-heterodyne system, such frequency conversion processes are effected one to three times. As a result, the thus created intermediate frequency (IF) signal is selected for a desired channel by the filter 206 for final channel selection. Further, the intermediate frequency signal is amplified by the intermediate frequency amplifier (which is normally an SAGC amplifier) 207 and then subjected to the demodulation process by the demodulating section 208.

Next, the demodulating section (orthogonal demodulating section) 208 to which the orthogonal signal generation system of this invention is applied is explained. In the orthogonal demodulating section 208, the intermediate frequency (IF) signal supplied from the intermediate frequency amplifier 207 is mixed with a local oscillator signal having the same frequency as the former signal, converted into a baseband and then detected.

Figure 13:
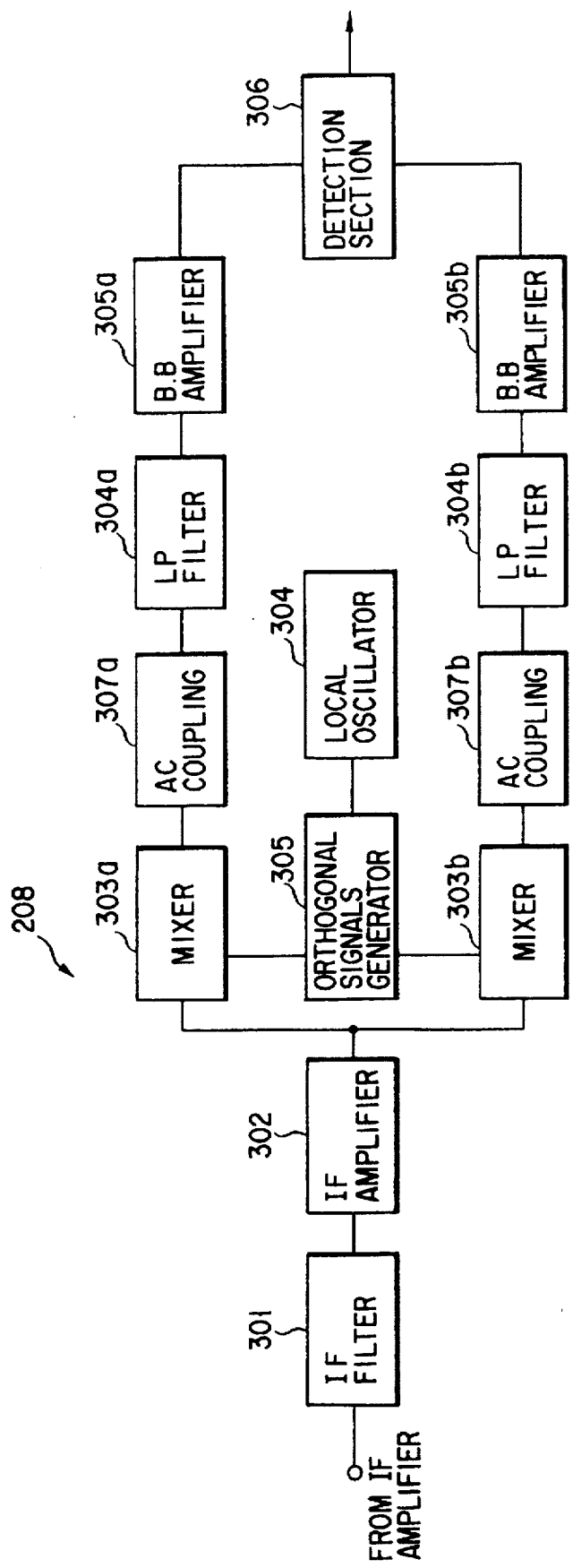
FIG. 13 is a block diagram showing the construction of a demodulator shown in FIG. 11 to which the orthogonal signal generation system of this invention is applied.

Now, the operation of the orthogonal demodulating section 208 is explained with reference to FIG. 13. FIG. 13 shows an example of the construction of the orthogonal demodulating section 208. The IF signal supplied from the intermediate frequency amplifier 207 passes an IF filter 301 and is then amplified by an IF amplifier 302. Further, the IF signal is divided into two channels after amplification. The respective signals divided into the two channels are mixed with carriers in the mixers 303a, 303b. The carriers supplied to the mixers 303a, 303b are signals whose phases are different from each other by 90° and which are created by use of the orthogonal signal generation circuit 305 to which the orthogonal signal generation system shown in FIG. 4 is applied, for example, based on a signal generated from the local oscillator 304. Therefore, the phases of the signals output from the mixers 303a, 303b are different from each other by 90°. By the above process, the IF signal supplied to the orthogonal demodulating section 208 is converted into baseband signals.

The thus converted baseband signals pass low-pass filters 304a, 304b having the anti-aliasing function and are then amplified by baseband amplifiers 305a, 305b. After this, the baseband signals are detected by a detector section 306 which effects the process such as delay detection or synchronous detection, for example. If a digital system is applied to the detection system, analog/digital converters may be used at the succeeding stages of the baseband amplifiers 305a, 305b.

Further, AC coupling sections 307a, 307b provided at the succeeding stage of the mixers 303a, 303b are used to eliminate the DC component in order to prevent the amplifiers 305a, 305b from being saturated by DC components generated in the mixers 303a, 303b. Recently, the above orthogonal modulating system is applied to various mobile communication devices in the demodulation of the orthogonal modulation signal such as a QPSK (quadrature phase shift keying) or QAM (quadrature amplitude modulation).

Figure 14:
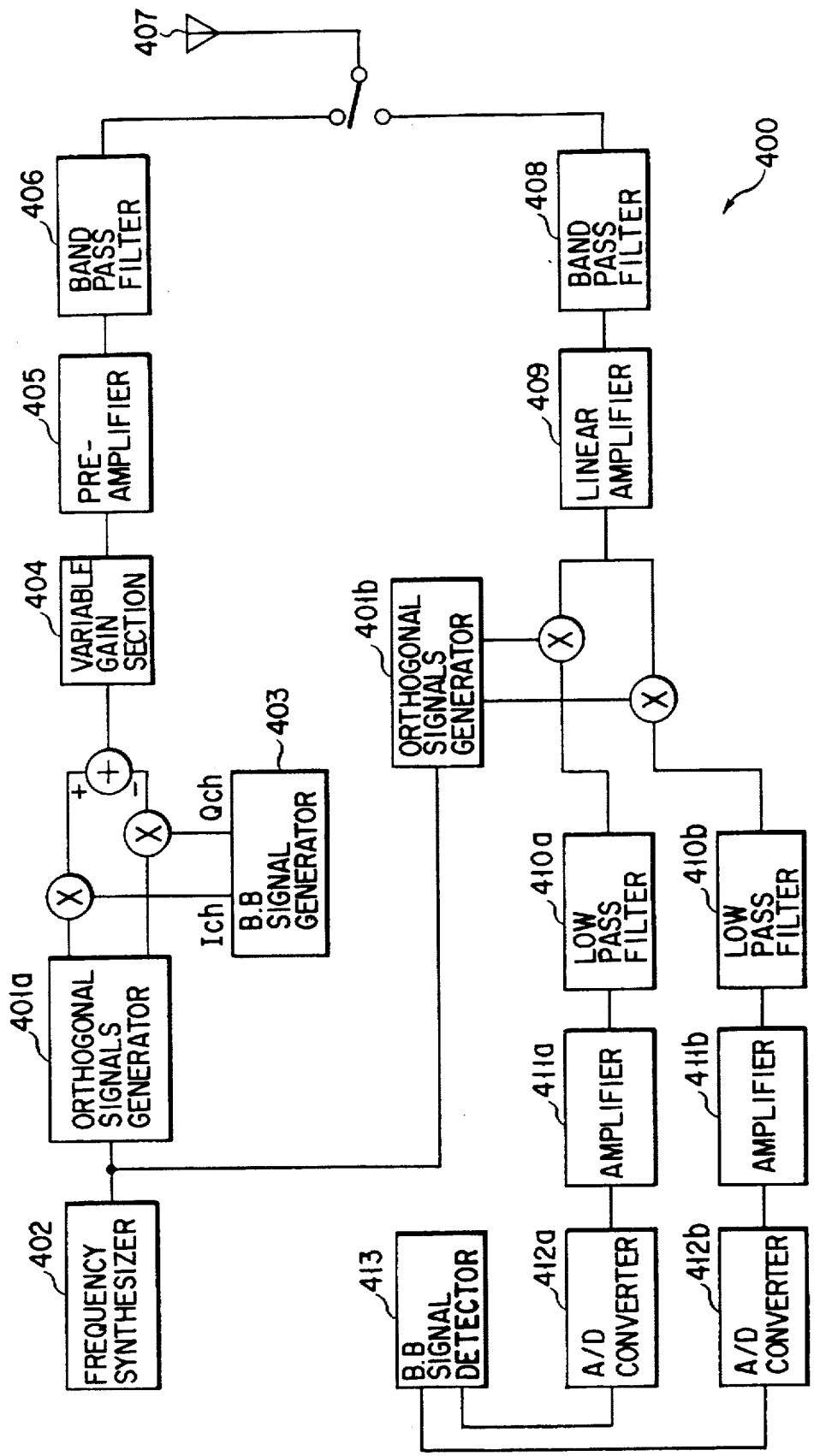
FIG. 14 is a block diagram showing the construction of a communication device to which a direct conversion system in which the orthogonal signal generation system of this invention is used is applied.

Next, a mobile communication device of direct conversion system to which this invention is applied is explained with reference to FIG. 14. FIG. 14 shows the construction of a communication device 400 having the construction for reception/transmission.

During transmitting period, an orthogonal signal generation circuit 401a to which the orthogonal signal generation system of this invention is applied (in which, for example, the construction shown in FIG. 4 is used) outputs signals whose phases are different from each other by 90° based on a local signal generated from a frequency synthesizer 402. The respective output signals are multiplied by signals Ich, Qch output from a baseband signal generation circuit 403. After this, a difference between the multiplied signals is derived and a difference signal is supplied to a variable gain section 404. In the variable gain section 404, an input signal is amplified without causing distortion in the signal and the amplified signal is output to a succeeding-stage preamplifier 405. A signal output from the variable gain section 404 via the preamplifier 405 and band-pass filter 406.

During receiving period, a signal received by the antenna 407 is subjected to the band-pass filtering process by a band-pass filter 408 to eliminate signal components of frequencies other than desired frequencies and the thus filtered signal is amplified by a linear amplifier 409. After this, the signal is divided into two channels and multiplied by signals whose phases are different from each other by 90° and which are generated from an orthogonal signal generation circuit 401b to which the orthogonal signal generation system is applied. The multiplied signals are respectively supplied to amplifiers 411a, 411b for amplification via low-pass filters 410a, 410b. Since the communication device shown in FIG. 13 utilizes a digital system, analog/digital converters 412, 412b are provided at the succeeding stage of the amplifiers 411a, 411b. Output signals of the analog/digital converters 412, 412b are supplied to a baseband signal detector 413.

In the above communication device of direct conversion system, there occurs a problem that the local signal generated from the frequency synthesizer 402 leaks into the RF signal. In modulator, this local signal leaks acceptable for wireless system is specified. In demodulator, this local signal leaks may cause BER (Bit Error Ratio) to increase, and may affect other wireless equipment, because this local signal radiate from antenna via Linear amplifier and Band pass filter. Therefore, when the direct conversion system is used, it is necessary to suppress the power of the local signal. In the orthogonal signal generation system according to this invention, since the high gain can be attained as described before, since the high gain can be attained as described before, the carrier of the same power as that of the conventional case can be output with the power of the local signal kept at the low level. Therefore, the problem mentioned above can be prevented by use of the orthogonal signal generation system.

In a mobile communication device including the above mentioned communication device of direct conversion system, the transmitting or receiving signal is usually unbalanced signal and a front end section of its transmitting/receiving system includes an unbalanced circuit. The front end section at the receiving side of the wireless device performs processing such as multiplying a received signal by a local oscillation signal generated from the local oscillator to obtain a low-frequency signal. With the mobile communication device, the front end section handles a frequency ranging from GHz to several tens of GHz and, if such a circuit is constructed of the unbalanced circuit, an unbalanced signal flows into the power supply line for supplying electric power to the circuit and into ground GND, so that the power supply line and ground become unsteady.

In order to solve this problem, various methods are conceived.

As one method for stabilizing the power supply line, for example, a method has been conceived for generating differential signals according to a high-frequency signal with the use of a differential circuit.

An attempt has been made to generate the differential signals according to a high frequency signal. In such an attempt, the simplest way to generate the differential signals according to the input high frequency signal by utilizing a delay line. If an object now under consideration is a mobile communication device, that method requires a large capacity and ensures no easy portability.

A phase shifter of the present invention comprising inductors and capacitors each having a size being capable of being used on a IC in order to achieve the above object, will be described. Note that, in embodiments to be described, balanced signals mean the differential signals. Therefore, an input signal being to be converted the differential signals is referred as an unbalanced signal. Generally, to the subsequent stage of an unbalanced to balanced conversion circuit constituting part of a phase shifter, an emitter follower circuit is connected as a buffer circuit for driving a differential amplifier connected to the next stage. This is used not to degenerate the phase shift accuracy of the phase shifter. That is, the parasitic capacitance in the output terminal of the phase shifter degenerates the phase shift of the phase shifter and, since the common-emitter circuit of the differential amplifier, etc., involves a greater input capacitance, the accuracy is degraded if the circuit is directly connected, so that, in order to prevent this situation, the emitter follower circuit is connected as set out above. From this it will be seen that the emitter follower circuit is essential as the buffer circuit.

In the emitter follower circuit required as the buffer circuit, the base-to-emitter operating voltage of its associated transistor elements is about 0.7 V for the case of an Si-bipolar (silicone-bipolar) element. In the previously known unbalanced to balanced conversion circuit, operating voltage being at least 2.0 [V] is required.

In the hand-held telephone system, etc., it is necessary to achieve a low-voltage unit, even in the sense that a compact power supply and low dissipation power are realized. It is also desirable to achieve a lower voltage unit.

The phase shifter according to this invention will be explained below with reference to the accompanying drawings. In particular, explanation will be given about the phase shifter for delivering output signals by 180° phase difference each other.

FIG. 15 is a schematic diagram of the phase shifter according to this invention. The schematic diagram of the phase shifter is basically the same as the above-mentioned orthogonal signal generation system. The phase shifter 500 comprises a signal input section 501, a phase-shifting section 502 and a signal output section 503, noting that these parts are supplied with a positive DC power supply+Vcc.

To the signal input section 501 an RF input signal is input from an input signal section 511 and the signal input section 501 delivers a current corresponding to the input signal to the phase-shifting section 502.

The phase-shifting section 502 includes two LC resonance circuits and, in accordance with the current from the signal input section 501, supplies mutually 180° phase-shifted signals to the signal output section 503. The signal output section 503 has buffer circuits and transmits signals which are supplied from the phase-shifting section 502 to a subsequent stage via output terminals 531 and 532.

FIG. 16 shows an arrangement of the signal input section 501 and phase-shifting section 502 in FIG. 15.

As shown in FIG. 16, the signal input section 501 comprises a linear impedance element Z and driver DRV. The linear impedance element Z is connected at one end to the DC supply Vcc and at the other end to ground GND through the driver DRV. As the driver DRV use is made of a variable current supply circuit which makes an output current variable in accordance with the input signal.

Further, the phase-shifting section 502 includes a parallel combination of a first series-connected circuit (first LC resonance circuit) of an inductor L51 and capacitor C51 and a second series-connected circuit (second resonance circuit) of a capacitor C52 and inductor L52; one of the inductor L51 of the first series-connected circuit and one of the capacitor C52 of the second series-connected circuit are connected to a DC power supply Vcc; and the other side of the capacitor C51 side of the first series-connected circuit and the other side of the inductor L52 of the second series circuit are connected to a connection point between the impedance element Z and the driver DRV.

Element value of the inductors L51 and L52 and that of the capacitors C51 and C52 respectively equal with respect to each other.

One end of the inductor L51 in the first LC resonance circuit is connected to the power supply Vcc and one end of the capacitor C52 in the second LC resonance circuit is connected to the power supply Vcc and the other end of the first resonance circuit and other end of the second resonance circuit are commonly connected together, and also connected at one end of the linear impedance element Z and this connection point 510 is connected at the output terminal of the driver DRV. The other end of the linear impedance element Z is connected to the power supply Vcc.

The terminal 521 corresponds to an output terminal of the first resonance circuit; Vo1 corresponds to an output voltage on the output terminal 521 of the first resonance circuit; the terminal 522 corresponds to the output terminal of the second resonance circuit; and Vo2 corresponds to an output voltage on the output terminal 522 of the second resonance circuit.

The RF input voltage and RF input current are represented by Vin and Iin, respectively. An RF input voltage Vin is supplied to the driver DRV of the signal input section 501 and, in accordance with the RF input voltage Vin, a current is supplied to the corresponding resonance circuits of the phase-shifting section 502. The phase-shifted voltages Vo1 and Vo2 emerge on the output terminals 521 and 522 of the first and second resonance circuits.

In this circuit arrangement, the resonance frequency ωo of the resonance circuit is given by $$\omega o = 1/\sqrt{(LC)}$$

and, when the frequency of the RF input signal is a resonance frequency, the impedance of the resonance circuit becomes zero theoretically and the voltages Vo1 and Vo2 of the output terminals 521 and 522 can be approximated with the following equations:

$$Vo1 = j(\omega o)L \times i/2 \quad (14)$$

$$Vo2 = -j/((\omega o)C) \times i/2 \quad (15)$$

$$|Vo1| = |Vo2| \quad (16)$$

where i represents the amplitude of ωo of the RF current signal Iin.

As evident from the equations (14), (15) and (16), Vo1 and Vo2 represent mutually 180° phase-shifted signals and their amplitudes are made equal to each other. In the case where these signals are amplified by the next stage amplifier, it is required that, in order to ensure the phase accuracy, an emitter follower circuit be connected to the output terminals 521 and 522 and that the output voltages Vo1, Vo2 be output to the above-mentioned amplifier through the emitter follower circuit.

FIG. 17 is a view showing such a circuit as set out above. In FIG. 17, the signal output section 503 is provided at the subsequent stage of the phase-shifting section 502. The signal output section 503 is comprised of transistors Tr1 and Tr2 connected in an emitter follower configuration. The output voltages Vo1 and Vo2 of the phase-shifting section 502 are transmitted respectively through the transistors Tr1 and Tr2 to the subsequent circuit.

An RF input signal is applied to the driver DRV constituting a variable current supply to obtain a current signal corresponding to the RF input signal. The current signal is output as the RF input signal to the phase-shifting section 502. As set out above, the frequency component of the RF input signal is given by ωo and, since the RF current does not flow-through the linear impedance element Z theoretically, the DC potentials of Vo1 and Vo2 are made equal to the power supply voltage Vcc.

The phase shifter 500 is operated in a range given by $$Vsig + V_{BE} + V_{CE} = 0.3 + 0.7 + 0.3(V) = 1.3(V)$$

As evident from the above, the phase shifter is operated with a smaller voltage than in the conventional counterpart by an amount minus an operating voltage $V_{BE}$ of one transistor.

In the case where the linear element (linear impedance element Z) is constructed with the use of the inductor in the phase shifter 500, a voltage drop resulting from the DC current is not developed and, even if the DC signal is contained in the RF input current Iin, operation can be made under the above-mentioned low voltage. Even in the case where the linear element is constructed using a resistor R and a DC signal $I_{DC}$ is present in the RF input current Iin, operation can be made at a lower voltage level than in the conventional case if $I_{DC} \times R < V_{BE}$.

Below shown are practical forms of a current supply circuit which is a driver DRV in the signal input section 504. In the practical circuit shown in FIG. 18, the base terminal of a transistor T1's emitter follower circuit is connected to a power supply Vcc through a resistor R1 and also to one end of a DC cut-off capacitor $C_{DC1}$. The other end of the DC cut-off capacitor $C_{DC1}$ is connected to an input terminal 511 to receive an RF input signal. The output terminal, that is, the emitter side, of the transistor T1 in the emitter follower configuration is connected to one end of a DC cut-off capacitor $C_{DC2}$ and the other end of the capacitor $C_{DC2}$ is connected to an output terminal 510. The output terminal 510 is connected to the phase-shifting section 502 as shown in FIGS. 15 to 17.

The driver DRV operates in the same range as those of the phase-shifting section 502 (unbalanced to balanced conversion circuit) and emitter follower circuit shown in FIG. 17. The operation of the driver DRV as shown in FIG. 18 will be explained below.

The RF input signal on the input terminal 511 passes through the DC cut-off capacitor $C_{DC1}$ and only the AC component of the input signal is transmitted to the base side of the transistor T1. The transmitted AC component is converted to a voltage by the resistor R1 connected to the base of the transistor T1 and the RF input voltage Vin is applied to the base of the transistor T1.

The emitter side of the transistor T1 in the emitter follower configuration is conducted by the DC cut-off capacitor $C_{DC2}$ to the corresponding resonance circuit in an AC way and, since the impedance of the resonance circuit in the phase-shifting circuit 502 is zero, the emitter of the transistor is grounded in the AC way.

Thus the voltage/current conversion is effected, by the transistor T1 in the emitter follower configuration, through the variation of a base-to-emitter voltage. Even if, in this case, the linear element (linear impedance element) connected in parallel with the phase-shifting section (unbalanced to balanced conversion circuit) 502 in FIGS. 16 and 17 is composed of a resistive element, there arises no flow of the DC current and, therefore, operation is possible in the presence of any voltage of over 1.3 [V]. That is, the operation is possible at a voltage of 1.3 [V] at the lowest and hence at the lower voltage.

Another circuit of the current supply circuit constituting the driver DRV will be explained with reference to FIG. 19.

As shown in FIG. 19, the base of a transistor T1 is grounded through a bias power supply $V_{BB}$. The emitter of the transistor T1 is grounded through a current supply I (current value $I_{DC}$) and connected to an input terminal 511 through a capacitor $C_{DC3}$. The collector terminal of the transistor T1 constitutes a current output terminal and corresponds to the output terminal 510 of the current supply as shown in FIGS. 16 and 17.

An impedance Rin of the driver DRV as looking from the emitter of the transistor is approximately represented by I/Gm where, with the use of DC current $I_{DC}$ in the transistor T1, Gm is represented by $I_{DC}/VT$ with VT representing a thermal voltage.

The input RF signal Vin received at the input terminal 511 is converted by the input resistance Rin to a Vin/Rin current signal and most of the current signal is output from the collector of the transistor T1.

Though not illustrated here, the same effect as set out above can be obtained even if the current supply I is replaced by a resistor $R_{DC}$. It is to be noted that the DC signal component $I_{DC}$ is determined by $(V_{BB}-V_{BE})/R_{DC}$.

In the case where the current supply circuit (driver) as shown in FIG. 19 is utilized as the driver DRV as shown in FIGS. 16 and 17, if the linear impedance element Z is used as the linear element, the phase-shifting section (unbalanced to balanced conversion circuit) is operated at a voltage above 1.3 [V], that is, at a voltage of 1.3 [V] at the lowest. If the linear impedance element Z is used as the resistor element, a voltage drop corresponding to $I_{DC} \times R$ occurs as set out above and, by that extend, the operation range is narrower. If, however, $I_{DC} \times R < V_{BE}$, the operation range can be made broader than in the conventional case.

Given a voltage applied to the current supply I by $V_{IDC}$, the operation range of the above-mentioned driver DRV (current supply circuit) is given below, $$V_{BB}=V_{BE}+V_{IDC}+Vsig.$$

Let $V_{IDC}$ and Vsig be about 0.3 [V]. $V_{BB}$ is sufficient if it is 1.3 [V]. The driver DRV (variable current supply circuit) does not determine the lower limit of the operation voltage of the phase-shifting section (unbalanced to balanced conversion circuit) 502.

By applying the variable current supply circuit DRV as shown in FIG. 18 or 19 as the driver DRV as shown in FIGS. 16 and 17, the phase shifter of high accuracy can be achieved at a low voltage. Although the RF signal has been explained as being one wave of ω0 only, if it is a narrow-band signal as used in a portable wireless system, there occurs no problem.

Now the above-mentioned phase shifter 500 will be explained below as being applied to the receiving system of the portable wireless terminal by way of example.

FIG. 20 shows a practical form of the phase shifter of this invention provided between a low noise amplifier (LNA) 542 and a frequency converter (MIX) 544 at the front end section of a receiving system of the portable wireless terminal, for example, a TDD (time division duplex). That is, in FIG. 20, a phase shifter is shown as a phase shifter (diff) 543.

A signal received at an antenna ANT is input to a band pass filter (BPF) 541 through a transmit/receiver changeover switch SW. An out-of-band signal used at the system (terminal) is suppressed by the band pass filter 541. That is, the received signal in which the out-of-band signal is suppressed is input to a low noise amplifier 542 where it is amplified.

The amplified signal of the low noise amplifier 542 is input to the phase shifter 543 where it is converted to differential signals. That is, two mutually 180° phase-shifted signals are generated at the phase shifter 543 and sent to the frequency conversion circuit MIX. An LO signal (local oscillator signal) which is delivered from a local oscillator OSC is also input to the frequency conversion circuit MIX. At the frequency converter MIX, multiplication is made between the RF signals and LO Signal for frequency conversion to get desired low frequencies. It is to be noted that such frequencies differ from system to system. Generally there are two systems, that is, a heterodyne system for effecting a conversion to an intermediate frequency (IF) and a direct modulation system for effecting a direct conversion to a baseband signal.

If, as set out above, the phase shifter 543 of this invention is provided between the low noise amplifier (LNA) 542 and the frequency converter (MIX) 544, then a stable power supply is obtained and it is possible to obtain better receiving performance such as noise and sensitivity, at a low voltage level. That is, the phase shifter 543 generates differential signals according to the RF input signal and is supplied through the emitter follower circuit to a subsequent-stage frequency converter 544. It is, therefore, possible to maintain, stable, a power supply line which is the feature of the generating of differential signals involved. Since the phase shifter 543 uses those circuit arrangements as shown in FIG. 16 or 17, operation is possible at a low voltage level.

FIG. 21 shows a phase shifter 553 of this invention as used at a preceding stage of a low noise amplifier 552. FIG. 22 shows a phase shifter 553 of this invention as used between a frequency converter (MIX) 564 and a local oscillator (OSC) 565 for supplying a local signal (LO signal) as a local oscillation signal.

By doing so, a stable power supply is obtained for the same reason as set out in FIG. 20 and it is also possible to obtain better receiving performance at a low voltage operation. Although only one phase shifter has been used for each of the block arrangements of FIGS. 20 to 22, it may combine the circuit arrangements of FIGS. 20 to 22 in any proper combination, that is to say, combine the circuit arrangements of FIGS. 20 and 22 or combine the circuit arrangements of FIGS. 21 and 22.

Figure 23:
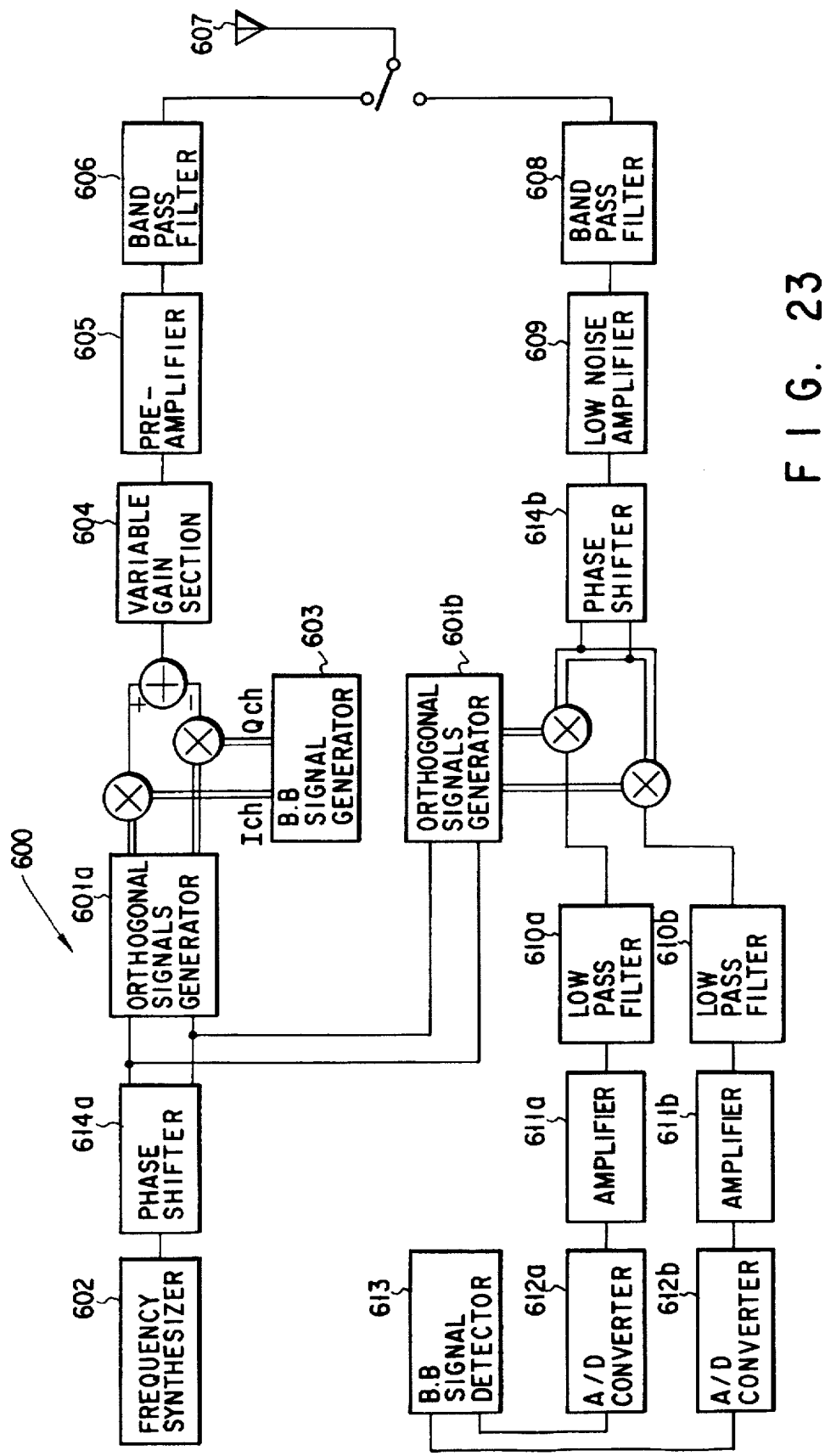
FIG. 23 is a block diagram showing a system configuration when the phase shifter of this invention is applied to the communication system of a direct conversion system as shown in FIG. 14.

A communication system 600 of a direct conversion system using a phase shifter as shown in FIG. 20 will be explained below with reference to FIG. 23. It is to be noted that the above-mentioned orthogonal signal generation circuit is applied to the communication system as shown in FIG. 23. Or the communication system 600 has a transmitting/receiving arrangement and the above-mentioned phase shifter is applied also to the transmitting system.

In the transmitting system, a phase shifter 614a is provided between a frequency synthesizer 602 and an orthogonal signal generator 601a. The phase shifter 614a receives a local signal generated by a frequency synthesizer 602 and, in accordance with the local signal, delivers two 180° phase-shifted signals. In the receiving system, a phase shifter 614b is provided between a low noise amplifier 609 and mixers. The phase shifter 614b receives a signal through a band pass filter and low noise amplifier 609, after being received by an antenna 607, and delivers two 180° phase shifted signals to two mixers in accordance with the received signal.

Such communication system 600 is the same as that shown in FIG. 14 except the operations related to the phase sifters 614a and 614b and any further explanation is omitted for brevity's sake.

Since, in the receiving system, the direct conversion system is such that the RF signal and local signal have the same frequency, if any local signals input to the mixers (frequency converter) are mixed with the RF signal, a DC offset occurs at the output of the frequency converter due to a self-mixing involved. That is, due to a leakage of the local signal generated by the local oscillator as an oscillation output into the RF signal, the DC offset occurs at the frequency converter for performing multiplication of the local signal and the RF input signal including the leaking signal out of the local signal. If the local signal leaks into a RF input line of the mixer, the local signal leaking into the RF input line is also transmitted into the low noise amplifier.

When, at this time, there occurs a variation in the output impedance of the low noise amplifier, the local signal leaking out of the frequency converter is reflected at the output of the low noise amplifier and again injected as the RF signal into the frequency converter. Therefore, when the output impedance of the low noise amplifier varies, any DC offset voltage as produced in the output of the frequency converter varies.

As shown in FIG. 23, if the phase shifter 614b of this invention is inserted between the linear amplifier (low noise amplifier) 609 and a frequency converter, its variation can be reduced as will be set out below. The above-mentioned circuit as shown in FIG. 16 can be represented as shown in FIG. 24. Here, the leaking LO signal injected from Vo2 flows into a power supply Vcc, not injected into the RF input current Iin, due to the presence of a resonance circuit of C1 and L1.

Thus it is possible to achieve isolation between the frequency converter and the low noise amplifier. And the local signal leaking into the low noise amplifier through the mixer can be theoretically set to zero.

According to the phase shifter of this invention, as set out above in more detail, it is possible to lower the operation voltage because the signal input section is made of the linear impedance element and a current supply for varying electric current in accordance with an RF input signal. Further, even in the case where any DC current component is contained in the RF input signal, it is possible to suppress any adverse influence resulting from a voltage drop and to operate at a low voltage level.

Further, the input signal is converted to differential ones and there occurs no leak of the RF signal into the power supply so that a stable power supply is ensured. Further, a buffer circuit in an emitter follower configuration is provided on the output stage of the phase-shifting section and the phase shifter of this invention can ensure a high accuracy conversion at low voltage operation, such as a high accuracy unbalanced to balanced conversion.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A phase shifter comprising:
   current control means including a variable current source, for controlling a current value according to an input signal;
   phase shifting means for outputting first and second signals having amplitude according to the controlled current value, whose phases are different from each other by a predetermined phase; and
   a power supply for supplying a preset voltage to said current control means and phase shifting means.

2. A phase shifter according to claim 1, wherein said current control means includes a linear element connected between said power supply and said variable current source, and said phase shifting means includes two resonance circuits which are connected in parallel with said linear element.

3. A phase shifter according to claim 2, wherein said phase shifting means outputs the first and second signals whose phases are different from each other by ±90°.

4. A phase shifter according to claim 2, wherein said phase shifting means outputs the first and second signals whose phases are different from each other by 180°.

5. A phase shifter according to claim 4, wherein said linear element includes an inductor.

6. A phase shifter according to claim 4, wherein said linear element includes a resistor.

7. A phase shifter according to claim 4, further comprising output means supplied with a preset voltage from said power supply and including first and second emitter followers each constructed by a transistor and a current source, said first emitter follower outputting the first signal output from said phase shifting means to an external circuit and said second emitter follower outputting the second signal to the external circuit.

8. A phase shifter according to claim 4, wherein each of said resonance circuits includes a series circuit of a capacitor and a inductor, and a resonance frequency of each of said resonance circuits is set nearly equal to the frequency of the input signal.

9. A phase shifter according to claim 4, wherein said phase shifter is configured to be used for frequency down-conversion in a super heterodyne operation of a communication device.

10. A phase shifter according to claim 4, wherein said phase shifter is configured to convert at least one of a baseband signal into a radio frequency signal in a transmission operation and another radio frequency into a baseband signal in a reception operation.

11. A phase shifter according to claim 4, wherein said current control means of said phase shifter is for inputting a radio frequency signal as the input signal, said phase shifter being configured to couple said first signal and said second signal to a frequency down-convertor that comprises multiply means for inputting a local signal, for multiplying the local signal and the first signal output from said phase shifting means, and for multiplying the input local signal and the second signal output from said phase shifting means.

12. An unbalanced to balanced converter comprising:

an unbalanced to balanced conversion circuit comprised of a parallel combination of first and second series-connected resonance circuits each having a capacitor and an inductor, the capacitor of one of the first and second series-connected resonance circuits and the inductor of the other of the first and second series-connected resonance circuits being connected to a power supply, the inductor of said one of the first and second series-connected resonance circuit and capacitor of said other of the first and second series-connected resonance circuit being connected to an input terminal, these capacitors and these inductors respectively having the same element values with respect to each other; and input means including a variable current supply circuit for varying a current value in accordance with an input signal and a linear element connected at a one-end side to the power supply and at an other-end side to an output terminal of the variable current supply circuit which is an input terminal of said unbalanced to balanced conversion circuit.

13. An unbalanced to balanced converter comprising:

an unbalanced to balanced conversion circuit using first and second series-connected resonance circuits each including a capacitor and an inductor, the capacitor of the first series-connected resonance circuit and the inductor of the second series-connected resonance circuit being connected to a power supply and the inductor of the first series-connected resonance circuit and the capacitor of the second series-connected resonance circuit being connected to a common connection terminal serving as an input terminal of an input signal and a connection terminal of the capacitor and the inductor in the first series-connected resonance circuit and that of the inductor and the capacitor in the second series-connected resonance circuit serving as balanced signal output terminals of the first and second series-connected resonance circuits, these capacitors and these inductors respectively having the same value with respect to each other;

input means including a variable current supply circuit for varying a current value in accordance with the input signal and a linear element connected at a one end to a power supply and at the other end to an unbalanced signal output terminal of the variable power supply circuit, an output on the unbalanced signal output terminal being supplied to the input terminal of said unbalanced to balanced conversion circuit; and a buffer circuit connected to the output terminals of said unbalanced to balanced conversion circuit.

14. An unbalanced to balanced converter according to claim 13, wherein the variable current supply circuit of said input means includes an emitter follower circuit, a base of the emitter follower circuit being supplied with the input signal and a capacitor being connected between an emitter of the emitter follower circuit and said common connection terminal.

15. The unbalanced to balanced converter according to claim 13, wherein the variable current supply circuit of said input means includes a common-base transistor, the collector of the common-base transistor being connected to the output terminal and the emitter thereof being connected to any one of a current supply and a resistor connected to a negative output terminal of the current supply and being supplied with the input signal.

* * * * *